United States Patent
Rafac

(10) Patent No.: US 10,401,704 B2
(45) Date of Patent: Sep. 3, 2019

(54) COMPENSATING FOR A PHYSICAL EFFECT IN AN OPTICAL SYSTEM

(71) Applicant: ASML Netherlands B.V., Veldhoven (NL)

(72) Inventor: Robert Jay Rafac, Encinitas, CA (US)

(73) Assignee: ASML Netherlands B.V., Veldhoven (NL)

( * ) Notice: Subject to any disclaimer, the term of this patent is extended or adjusted under 35 U.S.C. 154(b) by 435 days.

(21) Appl. No.: 15/349,600

(22) Filed: Nov. 11, 2016

(65) Prior Publication Data
US 2018/0136541 A1    May 17, 2018

(51) Int. Cl.
| | |
|---|---|
| G02F 1/33 | (2006.01) |
| G02B 27/00 | (2006.01) |
| G03F 7/20 | (2006.01) |
| G02F 1/29 | (2006.01) |

(52) U.S. Cl.
CPC ........... *G02F 1/33* (2013.01); *G02B 27/0068* (2013.01); *G03F 7/706* (2013.01); *G03F 7/70041* (2013.01); *G03F 7/70941* (2013.01); *G02F 2001/291* (2013.01); *G02F 2203/18* (2013.01); *G02F 2203/60* (2013.01)

(58) Field of Classification Search
CPC .... G02F 1/33; G02F 2203/18; G03F 7/70033; H05G 2/008; G02B 27/0068
See application file for complete search history.

(56) References Cited

U.S. PATENT DOCUMENTS

| | | | | |
|---|---|---|---|---|
| 4,105,953 A | * | 8/1978 | Jernigan | H01S 3/117 359/305 |
| 4,262,996 A | | 4/1981 | Yao | |
| 4,477,821 A | * | 10/1984 | Yamamoto | G02F 1/113 347/246 |
| 5,633,885 A | * | 5/1997 | Galvanauskas | H01S 5/0625 372/25 |
| 7,595,929 B1 | | 9/2009 | Gordon et al. | |

(Continued)

OTHER PUBLICATIONS

Hulme et al., "Improved acousto-optic modulators for CO2 heterodyne laser systems," Royal Signals and Radar Establishment, Worcs, England, 1983, downloaded from: http://spiedigitallibrary.org/ on Aug. 2, 2016, pp. 127-134 (8 total pages).

(Continued)

*Primary Examiner* — Wyatt A Stoffa
(74) *Attorney, Agent, or Firm* — DiBerardino McGovern IP Group LLC

(57) ABSTRACT

A wavefront of a light beam that exits an acousto-optic material is estimated; a control signal for an acousto-optic system that includes the acousto-optic material is generated, the control signal being based on the estimated wavefront of the light beam; and
the control signal is applied to the acousto-optic system to generate a frequency-chirped acoustic wave that propagates in the acousto-optic material, the frequency-chirped acoustic wave forming a transient diffractive element in the acousto-optic material, an interaction between the transient diffractive element and the light beam adjusting the wavefront of the light beam to compensate for a distortion of the wavefront of the light beam, the distortion of the wavefront being at least partially caused by a physical effect in the acousto-optic material.

29 Claims, 16 Drawing Sheets

(56) References Cited

U.S. PATENT DOCUMENTS

| | | | |
|---|---|---|---|
| 8,050,306 B2 | 11/2011 | Seguin et al. | |
| 8,404,998 B2* | 3/2013 | Unrath | B23K 26/0648 |
| | | | 219/121.67 |
| 8,716,677 B2* | 5/2014 | Cui | G02B 26/06 |
| | | | 250/458.1 |
| 8,848,277 B2 | 9/2014 | Sandstrom et al. | |
| 2002/0141035 A1* | 10/2002 | Davidson | G02F 1/33 |
| | | | 359/285 |
| 2003/0020923 A1* | 1/2003 | Dubois | G01B 11/164 |
| | | | 356/502 |
| 2003/0202236 A1* | 10/2003 | Khoshnevisan | G02B 26/0875 |
| | | | 359/305 |
| 2004/0105485 A1* | 6/2004 | Bures | G01K 7/32 |
| | | | 374/142 |
| 2006/0249488 A1* | 11/2006 | Jurgensen | B23K 26/0604 |
| | | | 219/121.68 |
| 2011/0134436 A1* | 6/2011 | Podoleanu | A61B 3/1015 |
| | | | 356/512 |
| 2013/0015367 A1* | 1/2013 | Cui | G02B 26/06 |
| | | | 250/459.1 |
| 2014/0375998 A1* | 12/2014 | Kasevich | G01B 9/02001 |
| | | | 356/450 |
| 2017/0099721 A1 | 4/2017 | Tao et al. | |
| 2018/0157147 A1* | 6/2018 | Rozsa | G02F 1/113 |

OTHER PUBLICATIONS

Frey et al., "Temperature-dependent refractive index of silicon and germanium," NASA Goddard Space Flight Center, Greenbelt, MD, Jun. 19, 2006, 10 total pages.

"Acousto-optic modulator," Wikipedia, the free encyclopedia, https://en.wikipedia.org/wiki/Acousto-optic_modulator, last modified on Feb. 11, 2016, downloaded on Aug. 2, 2016, 3 pages.

"Chirp," Wikipedia, the free encyclopedia, https://en.wikipedia.org/wiki/Chirp, last modified on Jul. 11, 2016, downloaded on Aug. 2, 2016, 6 pages.

Kaplan et al., "Acousto-optic lens with very fast focus scanning," Department of Physics of Complex Systems, Weizmann Institute of Science, Rehovot, Israel, Optics Letters, vol. 26, No. 14, Jul. 15, 2001, pp. 1078-1080 (3 total pages).

Konstantinou et al., "Dynamic wavefront shaping with an acousto-optic lens for laser scanning microscopy," Department of Neuroscience, Physiology and Pharmacology, University College of London, London, UK, Department of Electronic and Electrical Engineering, University College London, London, UK, Mar. 21, 2006, vol. 24, No. 6, Optics Express, pp. 6283-6299 (17 total pages).

Weiner, "Ultrafast optical pulse shaping: A tutorial review," Purdue University, School of Electrical and Computer Engineering, West Lafayette, IN, Elsevier B.V., Optics Communications 284, www.elsevier.com/locate/optcom, Apr. 15, 2011, pp. 3669-3692 (24 total pages).

Eschler, "Performance Limits of Acoustooptic Light Deflectors due to Thermal Effects," Forschungslaboratorien, München, DE, 1976, Appl. Phys. 9, pp. 289-306 (18 total pages).

Fröhlich et al., "A two-frequency acousto-optic modulator driver to improve the beam pointing stability during intensity ramps," Physikalisches Institut Universität Stuttgart, Stuttgart, DE, arXiv:physics/0701183v1, Jan. 16, 2007, pp. 1-4 (4 total pages).

Kirkby et al., "A compact acousto-optic lens for 2D and 3D femtosecond based 2-photon microscopy," Opt. Express 18(13), Jun. 21, 2010, pp. 13721-13745 (36 total pages).

Akemann et al., "Fast spatial beam shaping by acousto-optic diffraction for 3D non-linear microscopy," Opt. Express 23(22), Oct. 19, 2015, pp. 28191-28205 (15 total pages).

"Introduction to Acousto Optics," Brimrose Corporation of America, Sparks, Maryland, available at http://www.brimrose.com/pdfandwordfiles/aointro.pdf, downloaded on Sep. 16, 2016, 12 pages.

"Heat equation," Wikipedia, the free encyclopedia, https://en.wikipedia.org/wiki/Heat_equation, last modified on Sep. 29, 2016, downloaded on Sep. 29, 2016, 9 pages.

Pletke et al., "Temperature distribution in a metal cylinder containing a heat source," Iowa State University, Ames, Iowa, Aug. 1953, ISC-428, 23 pages.

Lakshminarayanan et al."Zernike polynominals: a guide," School of Optometry, University of Waterloo, Waterloo, Ontario, CA, Michigan Center for Theoretical Physics, University of Michigan, Ann Arbor, MI, Grand River Hospital, Kitchener, Ontario, CA, Journal of Modern Optics, vol. 58, No. 7, Apr. 10, 2011, pp. 545-561 (18 total pages).

Blaine R. Copenheaver, U.S. International Searching Authority, International Search Report and Written Opinion, counterpart PCT Application No. PCT/US2017/056870, dated Jan. 8, 2018, 17 pages total.

* cited by examiner

COMPENSATING FOR A PHYSICAL EFFECT IN AN OPTICAL SYSTEM

TECHNICAL FIELD

This disclosure relates to compensating for a physical effect in an optical system. The physical effect may be a thermal effect in an acousto-optic material. For example, a wavefront distortion caused by the heating of the acousto-optic material may be corrected.

BACKGROUND

An acousto-optic modulator (AOM) includes a transducer and an acousto-optic material. The transducer receives an electrical signal and converts the electrical signal into an acoustic wave that propagates in the acousto-optic material. Light incident on the acoustic-optic material is diffracted by the periodic index of refraction modulation that occurs while the acoustic wave propagates in the acousto-optic material.

An AOM may be used in an extreme ultraviolet (EUV) light source to, for example, deflect stray light from a beam path in a certain direction (for example, into another beam path and/or into a beam dump) and/or at certain times. To deflect light using the AOM, an acoustic wave having a constant frequency as a function of time may be injected into an acousto-optic material of the AOM. The AOM may be computer controlled, for example, the AOM may be controlled by a process stored in an electronic memory as executable instructions, the instructions being capable of executing on one or more electronic processors.

EUV light includes, for example, electromagnetic radiation having wavelengths of around 50 nm or less (also sometimes referred to as soft x-rays), including light at a wavelength of about 13 nm. EUV light may be used in a photolithography processes to produce extremely small features in substrates, for example, silicon wafers.

SUMMARY

In one general aspect, a wavefront of a light beam that exits an acousto-optic material is estimated; a control signal for an acousto-optic system that includes the acousto-optic material is generated, the control signal being based on the estimated wavefront of the light beam; and the control signal is applied to the acousto-optic system to generate a frequency-chirped acoustic wave that propagates in the acousto-optic material, the frequency-chirped acoustic wave forming a transient diffractive element in the acousto-optic material, an interaction between the transient diffractive element and the light beam adjusting the wavefront of the light beam to compensate for a distortion of the wavefront of the light beam, the distortion of the wavefront being at least partially caused by a physical effect in the acousto-optic material.

Implementations may include one or more of the following features. Estimating the wavefront of the light beam that exits the acousto-optic material may include receiving at least a portion of the light beam that exits the acousto-optic material and estimating the wavefront based on the received portion of the first pulse of the light beam.

The physical effect of the acousto-optic material may be a thermal distortion of the acousto-optic material. Estimating the wavefront of the light beam that exits the acousto-optic material may include accessing a plurality of temperature measurements of the acousto-optic material, each of the plurality of temperature measurements being a temperature of a different portion of the acousto-optic material, estimating, based on the accessed plurality of temperatures, a temperature distribution of the acousto-optic material, estimating, based on the estimated temperature distribution of the acousto-optic material, a spatial distribution of an index of refraction of the acousto-optic material, and estimating the wavefront of the light beam that exits the acousto-optic material using the estimated index of refraction of the acousto-optic material.

The acousto-optic material may absorb one or more of the light beam, the frequency-chirped acoustic wave, and an acoustic wave other than the frequency-chirped acoustic wave that propagates in the acousto-optic material as heat, and the physical effect of the acousto-optic material may be a thermal distortion arising from the absorbed heat.

The transient diffractive element also may compensate the light beam for effects other than the physical effect of the acousto-optic material. The effects other than the physical effect of the acousto-optic material may include a physical effect of an optical element other than the acousto-optic material, the optical element being positioned to interact with the light beam.

The light beam may be a pulsed light beam, receiving at least a portion of the light beam may include receiving a portion of a first pulse of the light beam, determining a wavefront of the light beam may include determining a wavefront based on the received portion of the first pulse of the light beam, and the generated frequency-chirped acoustic wave may propagate in the acousto-optic material and may form the transient diffractive element while a second pulse of the light beam passes through the acousto-optic material, the second pulse of the light beam occurring after the first pulse of the light beam. The first and second pulses have a temporal duration of 100 nanoseconds (ns) or less, and the transient diffractive element may propagate 500 microns (μm) or less in the acousto-optic material while the second pulse passes through the acousto-optic material such that the second pulse interacts with the transient diffractive element and is diffracted by transient diffractive element at an angle that depends on a frequency of the frequency-chirped acoustic wave.

The physical effect of the acousto-optic material may include a thermal distortion of the acousto-optic material, the thermal distortion at least partially causing a distortion of the wavefront of the light beam that exits the acousto-optic material.

In some implementations, an initial control signal for the acousto-optic system is generated, the initial control signal being independent of the estimated wavefront of the light beam; and the initial control signal is applied to the acousto-optic system to generate a constant frequency acoustic wave in the acousto-optic material prior to estimating the wavefront of the light beam, the constant frequency acoustic wave forming an initial transient diffractive element in the acousto-optic material, where generation of the initial transient diffractive element is the physical effect that at least partially causes the distortion of the wavefront.

In another general aspect, a system for an extreme ultraviolet (EUV) light source includes an optical system, the optical system including an acousto-optic material in which acoustic waves propagate, the acousto-optic material being configured to be positioned on a beam path, and an acoustic wave generator, the acoustic wave generator including a transducer configured to couple to the acousto-optic material, and a waveform generator configured to couple to the transducer; a sensing apparatus configured to measure data related to a light beam that propagates on the beam path or data related to a condition of the acousto-optic material; and a control system coupled to the sensing apparatus and the waveform generator, the control system being configured to: estimate a wavefront of the light beam based on data measured by the sensing apparatus, generate a control signal based on the estimated wavefront of the light beam, and provide the control signal to the optical system, the control signal being sufficient to cause the acoustic wave generator to provide a frequency-chirped acoustic wave to the acousto-optic material, the frequency-chirped acoustic wave forming a transient diffractive element in the acousto-optic material, an interaction between the transient diffractive element and the light beam adjusting the wavefront of the light beam to compensate for a physical effect of the acousto-optic material.

Implementations may include one or more of the following features. The physical effect of the acousto-optic material may include a spatially varying index of refraction in the acousto-optic material. The physical effect of the acousto-optic material may include a thermal distortion, and the index of refraction at any particular location within the acousto-optic material may be related to an amount of heat absorbed by the acousto-optic material and a distance between one or more absorption locations and the particular location, the absorption locations being a region in the crystal where heat is absorbed. The acousto-optic material may absorb one or more of the light beam, the frequency-chirped acoustic wave, and an acoustic wave other than the frequency-chirped acoustic wave that propagates in the acousto-optic material, and the physical effect of the acousto-optic material may include a thermal distortion arising from the absorbed heat. The acousto-optic material may include a material that is substantially transparent to light having a wavelength between 10 µm and 11 µm.

The acousto-optic material may include germanium (Ge) or gallium arsenide (GaAs). The optical system may lack an acoustic terminator, the acoustic terminator being an element that is part of or in physical connection with the acousto-optic material and configured to perform one or more of absorption, scattering, transmission, or redirection of the frequency-chirped acoustic wave. The light source may include an extreme ultraviolet (EUV) light source. The optical system also may include a radio-frequency (RF) electrical amplifier coupled to the waveform generator and the transducer, the waveform generator being configured to couple to the transducer through the RF electrical amplifier.

The sensing apparatus may be configured to measure data related to a condition of the acousto-optic material, the condition being related to a temperature of the acousto-optic material.

In another general aspect, an extreme ultraviolet (EUV) light source includes a light-generation module; one or more pre-amplifiers; one or more power amplifiers, one or more pre-amplifiers being between the light-generation module and the one or more power amplifiers; and an acousto-optic system including: an acousto-optic material between one of the one or more power amplifiers and the light-generation module, a waveform generator, a transducer configured to send a waveform from the waveform generator into the acousto-optic material as an acoustic wave, and a control system coupled to the waveform generator, the control system configured to estimate a wavefront of a light beam that exits the acousto-optic material and provide a control signal based on the estimated wavefront to the waveform generator, the control signal being sufficient to cause the waveform generator to generate a frequency-chirped waveform that, when injected into the acousto-optic material by the transducer, compensates the wavefront of a light beam propagating in the acousto-optic material for a physical effect of the acousto-optic material.

Implementations may include one or more of the following features. The acousto-optic material may be between one of the pre-amplifiers and one of the power amplifiers. The EUV light source also may include a temperature sensor coupled to the control system, the temperature sensor configured to measure a temperature of the acousto-optic material, and where the control system being configured to determine a characteristic of the acousto-optic material includes the control system being configured to determine a temperature of the acousto-optic material based on data from the temperature sensor.

In some implementations, the EUV light source includes an optical sensing apparatus configured to receive light that propagates through the acousto-optic material and to sense a wavefront of the received light, and where the control system being configured to determine a characteristic of the acousto-optic material may include the control system being configured to determine the wavefront of the received light based on data from the optical sensing apparatus. The optical sensing apparatus may include one or more of a graded phase mask, a wavefront sensing camera, and an interferometer.

In another general aspect, a constant frequency acoustic wave is applied to an acousto-optic material, the constant frequency acoustic wave forming an initial transient diffractive element in the acousto-optic material; a wavefront of a light beam that exits the acousto-optic material is estimated after interacting with the initial transient diffractive element; the constant frequency acoustic wave is modified based on the estimated wavefront to form a modified acoustic wave, the modified acoustic wave having a frequency chirp; and the modified acoustic wave is applied to the acousto-optic material, the modified acoustic wave forming a corrective transient diffractive element, an interaction between the corrective transient diffractive element and the light beam adjusting the wavefront of the light beam to compensate for a distortion of the wavefront, the distortion being at least partially caused by the generation of the initial transient diffractive element.

Implementations may include one or more of the following features. The wavefront of the light beam that exits the acousto-optic material is estimated based on the temperature of the acousto-optic material. Estimating the wavefront of the light beam that exits the acousto-optic material may include measuring the wavefront of the light beam that exits the acousto-optic material.

Implementations of any of the techniques described above may include an EUV light source, a system, a method, a process, a device, or an apparatus. The details of one or more implementations are set forth in the accompanying drawings and the description below. Other features will be apparent from the description and drawings, and from the claims.

DRAWING DESCRIPTION

FIGS. 1, 2, 3, and 4A are block diagrams of exemplary acousto-optic systems.

FIGS. 8, 9A, 10, and 11 are block diagrams of exemplary extreme ultraviolet (EUV) light sources in which the acousto-optic systems of FIGS. 1-3 and 4A may be used.

Figure 9A:
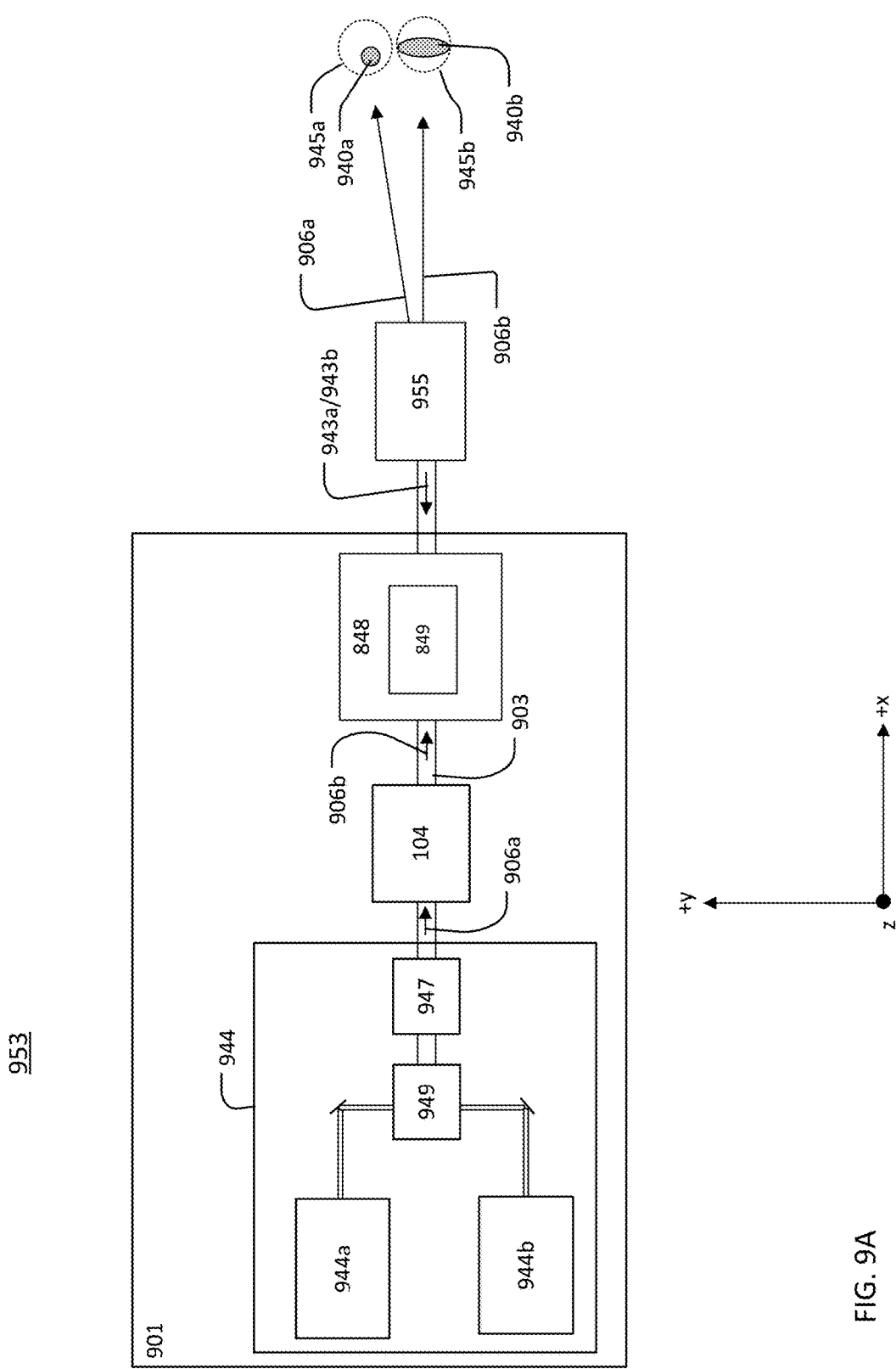
Figure 9B:
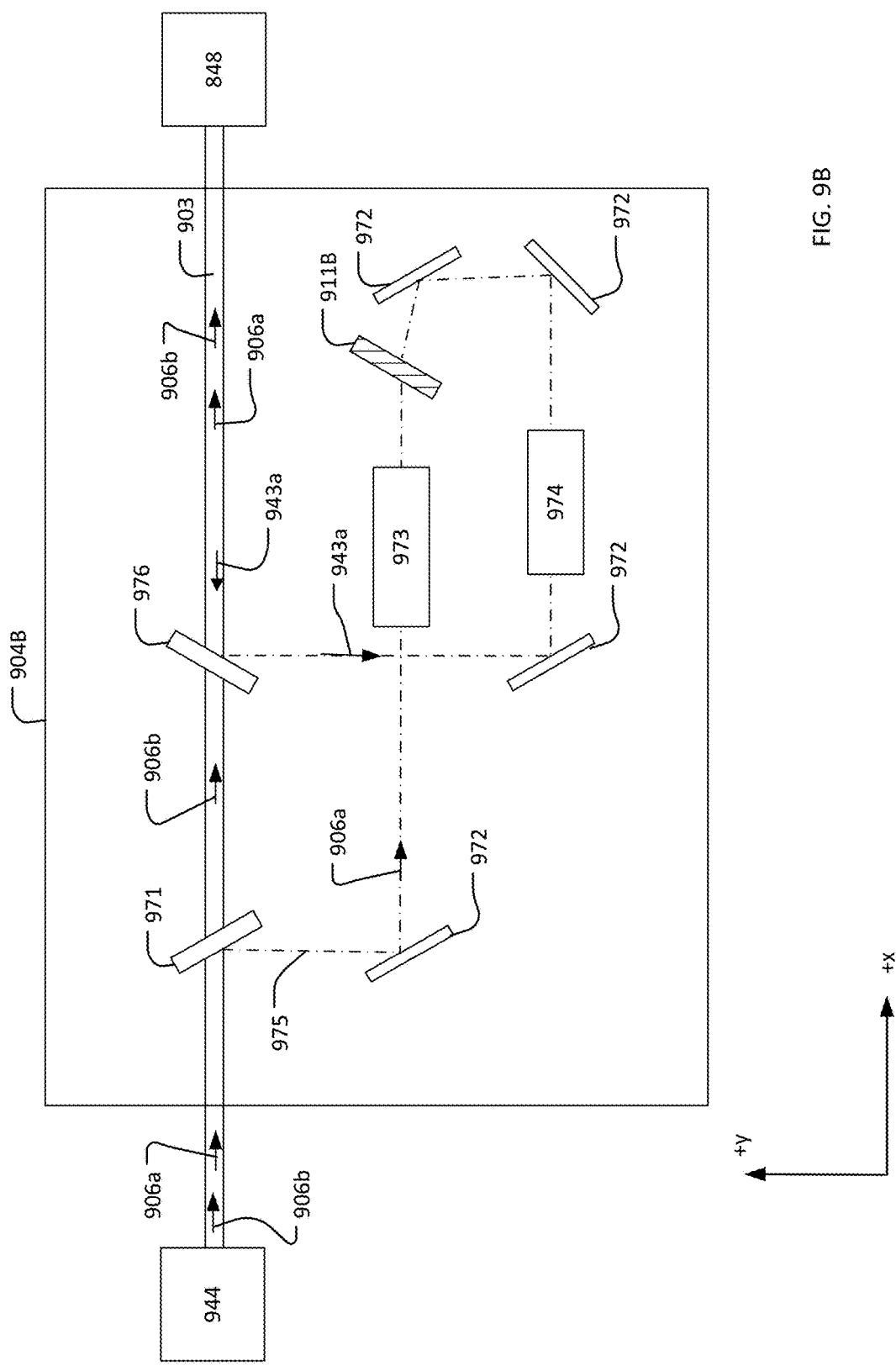
Figure 9C:
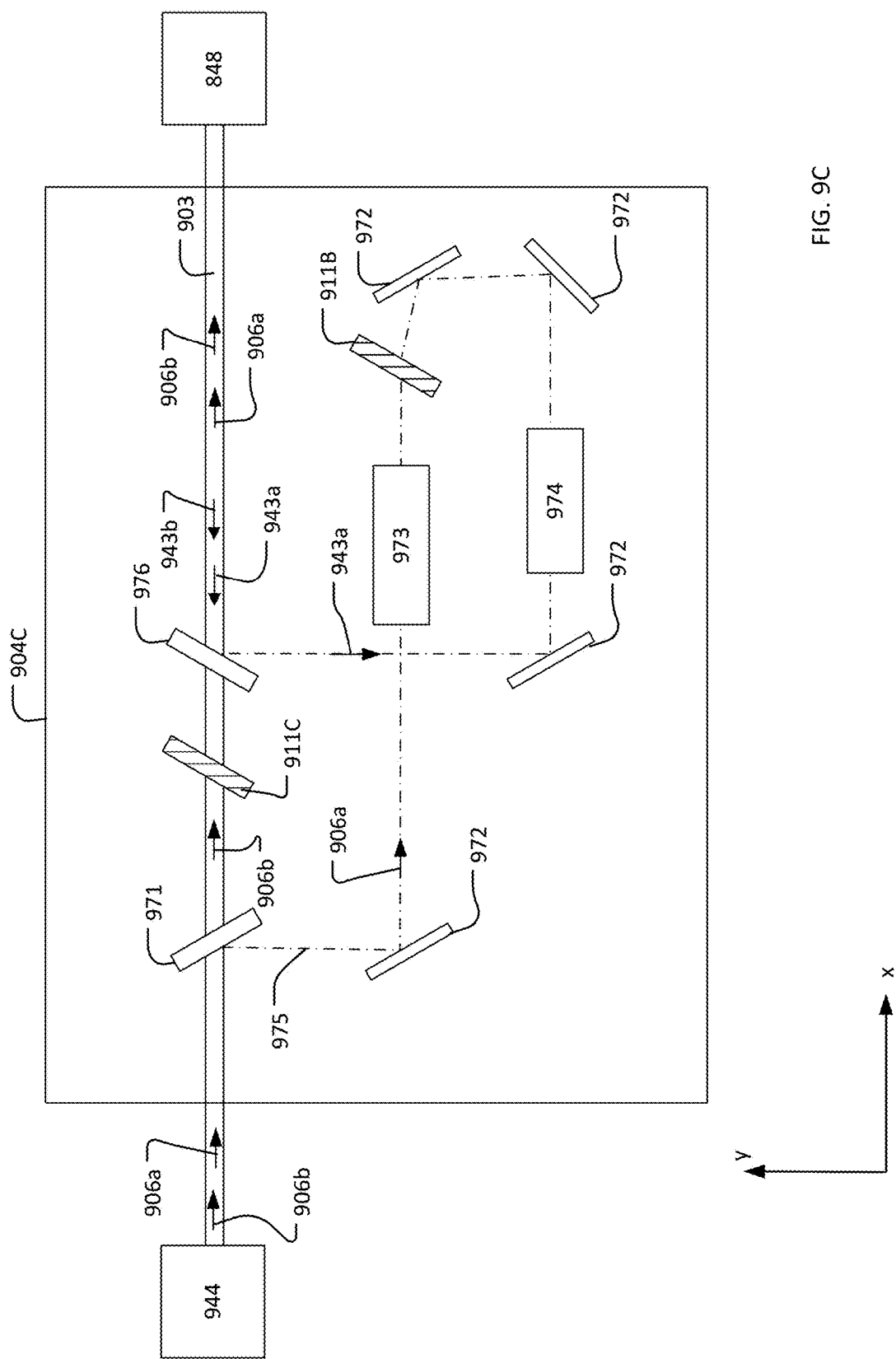

FIGS. 9B and 9C are block diagrams of exemplary acousto-optic systems.

Figure 12A:
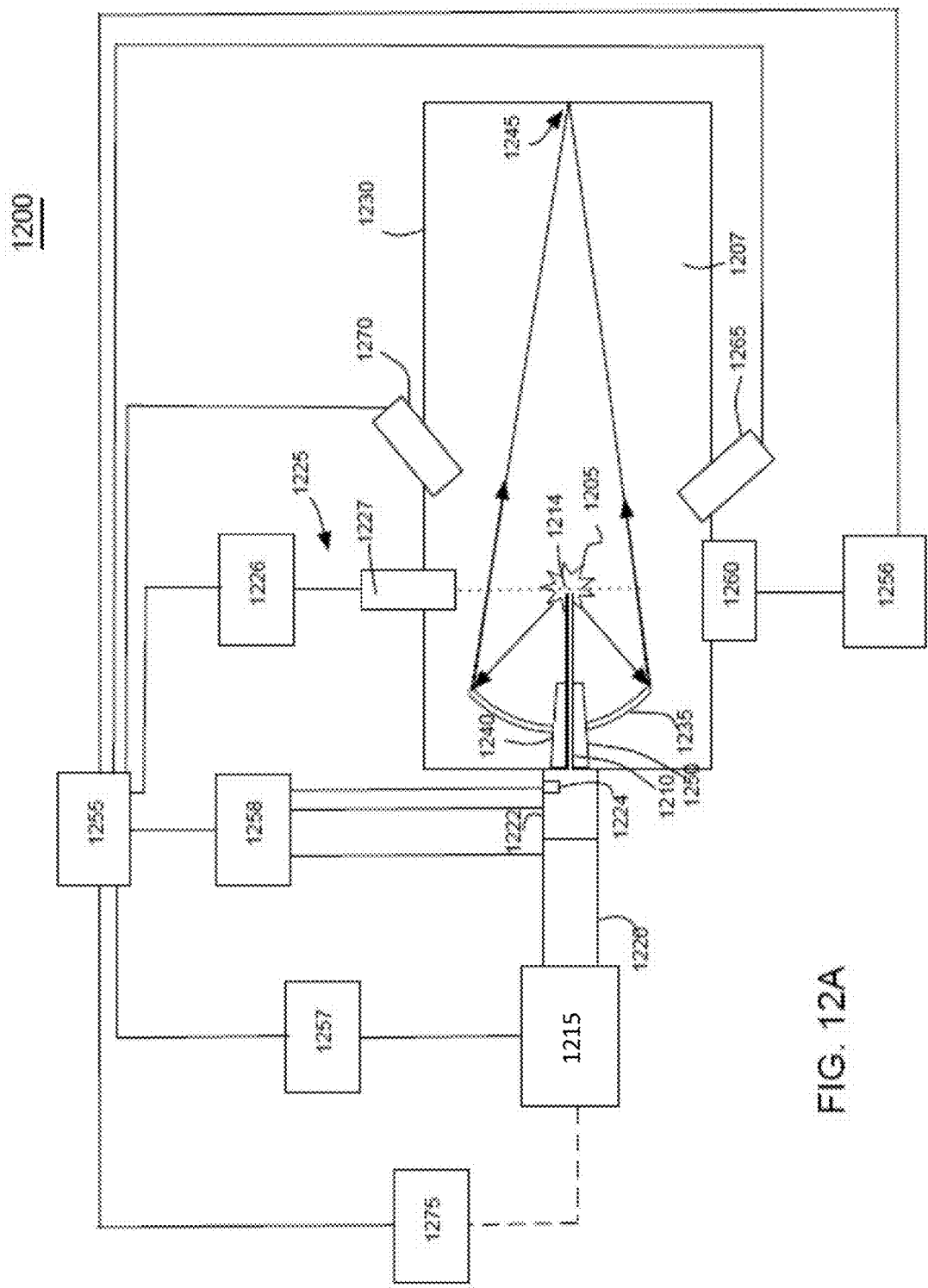
Figure 12B:
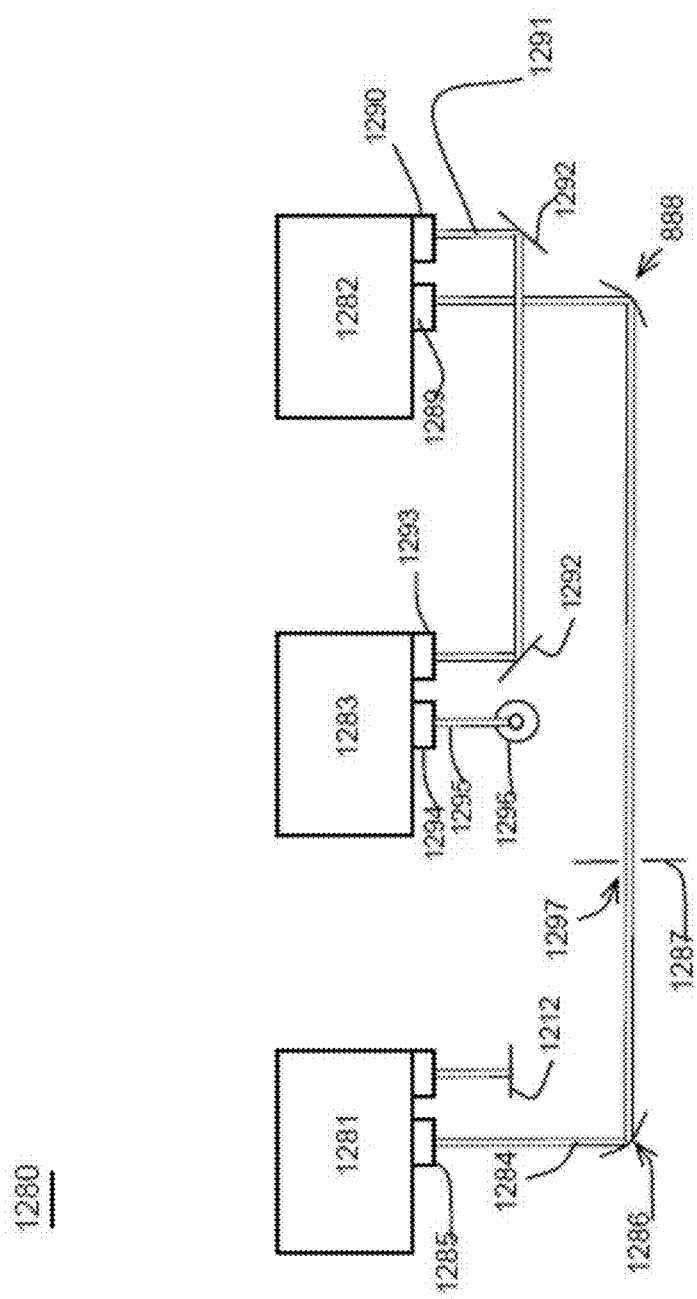

FIGS. 12A and 12B are block diagrams of a drive laser system for an extreme EUV light source.

DETAILED DESCRIPTION

Techniques for applying a frequency-chirped acoustic wave to an acousto-optic device to compensate for spurious or unwanted wavefront distortions in a beam that passes through an acousto-optic material of the acousto-optic device are discussed. The spurious or unwanted wavefront distortions arise from a physical effect (such as heating) in the acousto-optic material itself.

Figure 1:
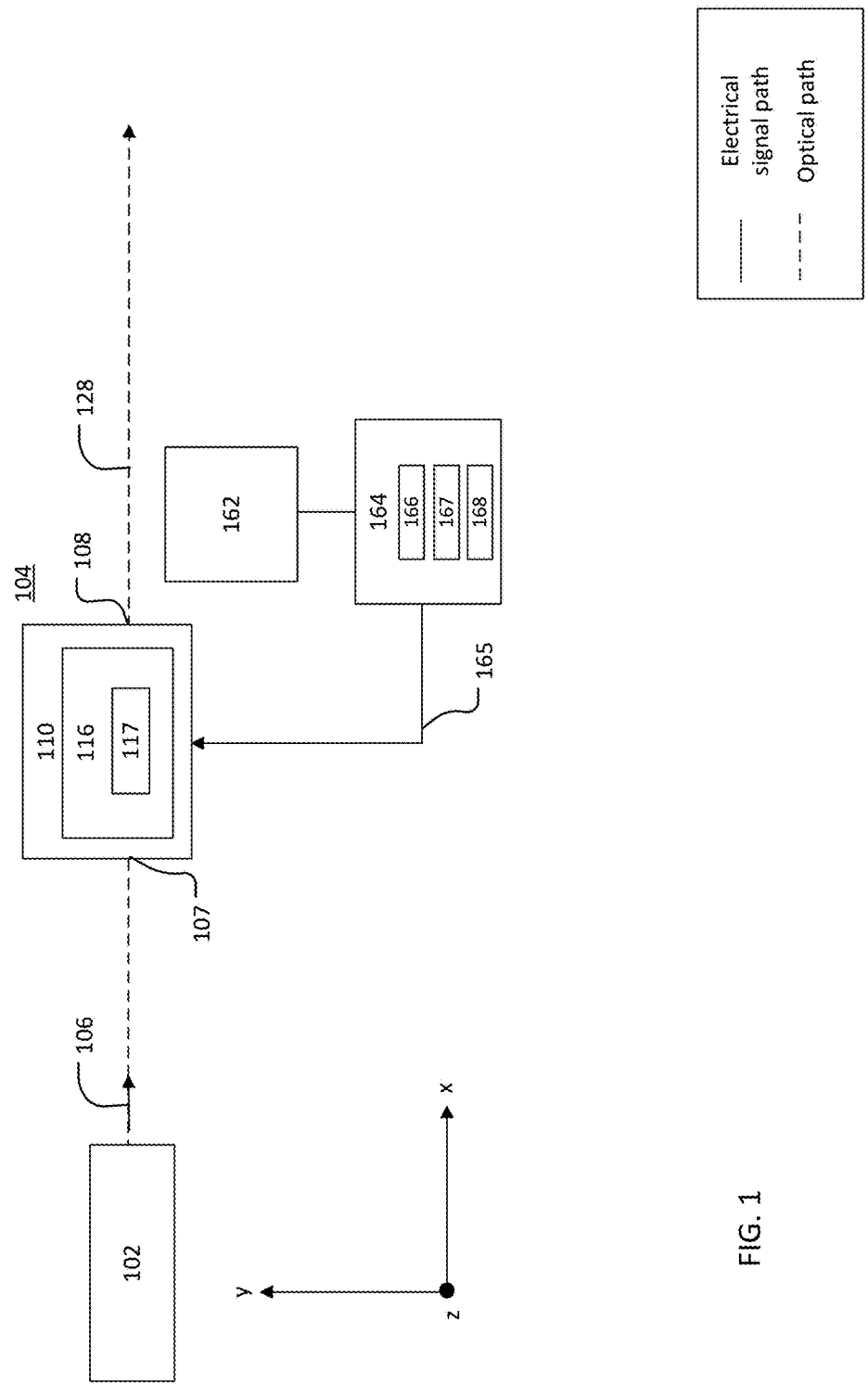

FIG. 1 is a block diagram of a system 100 that includes a light source 102 and an acousto-optic system 104, which includes an acousto-optic material 116. The light source 102 emits a beam 106 onto an optical path 128 (shown with a dashed line). The beam 106 enters the acousto-optic system 104 at an input side 107. The beam 106 passes through the acousto-optic material 116 prior to exiting the acousto-optic system 104 at an output side 108.

The acousto-optic material 116 is part of an optical system 110. The optical system 110 may have a primary purpose of, for example, blocking reflections that enter the acousto-optic system 104 at the output side 108 instead of the input side 107 or blocking stray light, such as amplified spontaneous emission (ASE), that may propagate in the system 100. The optical system 110 may block reflections by, for example, deflecting reflections and/or stray light away from the beam path 128. In some implementations, the optical system 110 may have a primary purpose of deflecting the light beam 106 (which is not a reflection or stray light) onto the beam path 128 so that the light beam 106 is able to propagate to another portion of the system 100. The deflection may be achieved by applying an acoustic wave that has a frequency that is substantially constant in time to the acousto-optic material 116.

During use, physical effects in the acousto-optic material 116 may cause unintentional distortions of the wavefront of the beam 106. The physical effects may be any effect or process that leads to a change in an optical property of the acousto-optic material 116. For example, the physical effect may be an effect or a process that changes the index of refraction (n) of the material 116 and/or the speed of sound in the material 116. The change in index of refraction (n) may be the result of a thermal effect (such as heating that occurs when an acoustic wave is applied the material 116) or another physical effect (such as an external and non-acoustic mechanical force applied to the acousto-optic material 116). The speed of sound also may change due to a thermal effect (such as heating). For example, under ordinary operating conditions, when an acoustic wave is injected into the acousto-optic material 116 along a direction, the wave propagates through the acousto-optic material 116 along the same direction. However, changes in the sound speed in the material 116 may cause the acoustic wave to curve as it propagates through the material 116.

The beam distortions caused by the physical effect in the acousto-optic material 116 are assessed by estimating a wavefront of the beam 106 at the output side 108 (after the beam 106 passes through the material 116). The wavefront is estimated at a control system 164 using data from a sensor 162. The sensor 162 may be a wavefront sensor such as the sensor 362 of FIG. 3 and/or a collection of temperature sensors, such as the temperature sensors 462a-462d shown in FIGS. 4A and 4B. A control signal 165 is generated based on the estimated wavefront. The control signal 165 is applied to the optical system 110 to cause a frequency-chirped acoustic wave to be injected into the acousto-optic material 116.

A frequency-chirped wave is a wave in which the frequency changes in time. Thus, the frequency-chirped acoustic wave is an acoustic wave that has a frequency that changes in time. When propagating in the acousto-optic material 116, the acoustic wave forms regions of compression (higher index of refraction) and regions of rarefication (lower index of refraction) that have a spatial arrangement that depends on the frequency of the acoustic wave. The regions of compression and rarefication create a transient diffractive element 117 in the material 116. The transient diffractive element 117 is a spatially-varying index of refraction pattern that travels in the material 116 at the speed of sound of the material 116. The diffractive element 117 is present in the acousto-optic material 116 only when the acoustic wave propagates in the acousto-optic material 116. In other words, the diffractive element 117 is transient or temporary as opposed to permanent, and the diffractive element 117 is fixed in space only for an instant in time.

An interaction between the transient diffractive element 117 and the beam 106 results in amplitude and/or phase modulation of the beam 106. The transient diffractive element 117 diffracts the beam 106 at an angle that depends on the spatial arrangement of the regions of compression and rarefication. Thus, the frequency content of the acoustic wave that propagates in the material 116 determines the diffraction properties of the transient diffractive element 117. The frequency content of the acoustic wave is determined by the control system 164 based on the determined wavefront of the beam 106 at the side 108. A wavefront of a light beam is the collection of points on the beam that have the same phase. Under ideal conditions, the wavefront is flat, meaning that all the points on the beam that have the same phase arrive at a physical location at the same time. When the wavefront of the beam 106 is not flat at the side 108, the control system 164 determines the frequency content of the acoustic wave that would form a transient diffractive element 117 with diffractive properties capable of removing or mitigating the wavefront distortion by interacting with the beam 106. In this way, the optical system 110 is able to perform the primary purpose (for example, blocking reflections), and wavefront distortions that may arise from performing that primary purpose are corrected without adding any additional optical elements to the system 100.

The beam 106 may be a high-power (for example, tens or hundreds of Watts (W)) beam of light with a wavelength in the long-wave (LW) infrared region (for example, 9-12 microns (μm), 10.26 μm, 10.19 μm-10.26 μm or 10.59 μm). The acousto-optic material 116 is a material that is at least partially transmissive at the wavelength of the beam 106. For example, in implementations in which the wavelength is between 9-12 μm (such as, for example, 10.26 μm or 10.59 μm), the acousto-optic material 116 may be germanium (Ge)

or gallium arsenide (GaAs). Materials that are transmissive in the LW infrared region also tend to have a relatively high thermal optic coefficient (dn/dT), which is a metric that indicates the amount of change in index of refraction (dn) with a change in temperature (dT), and a relatively high absorption coefficient, which is a metric that indicates how much of incident energy the material absorbs (perhaps as heat). For example, the dn/dT of Ge is $396 \times 10^{-6}$ per degree Kelvin ($K^{-1}$). The dn/dT of GaAs is $147 \times 10^{-6}$ $K^{-1}$. By contrast, the dn/dT of silica glass (which is not transmissive in the infrared above about 4 μm) is $12 \times 10^{-6}$ $K^{-1}$. At 10.6 μm, the absorption coefficient of Ge is 0.027 per centimeter ($cm^{-1}$) and the absorption coefficient of GaAs is 0.01 $cm^{-1}$. At 1 μm (an example operating wavelength for applications that use silica glass), the absorption coefficient of silica glass is $10 \times 10^{-6}$ $cm^{-1}$.

Thus, an acousto-optic material, such as Ge or GaAs, suitable for applications that use an optical beam at a LW infrared wavelength tends to absorb more energy, may have a greater increase in temperature in the volume through which the beam passes, and may have a greater variation in the index of refraction compared to materials that are suitable for other wavelengths (such as visible wavelengths). The heating and the corresponding changes in index of refraction may distort the wavefront of the beam 106 as it passes through the acousto-optic material 116. The distortions may cause pointing errors and/or focusing errors. Pointing errors cause the beam 106 to be in an incorrect and/or unexpected location in the y-z plane. Focusing errors cause the focus of the beam 106 to occur at an unexpected and/or incorrect location along the x direction. Additionally or alternatively, focusing errors may degrade the focus quality. For example, focusing errors may lead to the beam 106 having a larger or smaller spot size in the focal plane as compared to an optimal and/or expected spot size. Focusing and pointing errors become more pronounced in applications in which the optical system 110 is relatively far (for example, tens of meters) from a desired focus point. An example of such an application is an EUV light source, such as shown in FIGS. 8-11.

In addition to the absorbed optical power, the acousto-optic material 116 may become heated due to absorbed acoustic power from a transducer (such as the transducers 114a and 114b shown in FIG. 2) used to inject the acoustic wave into the acousto-optic material 116. In some applications that employ the optical system 110, such as an EUV light source, the light beam 106 has a relatively high optical power (for example, tens or hundreds of Watts), a relatively large diameter in a plane perpendicular to the direction of propagation, and, as discussed above, the materials used for the acousto-optic material 116 tend to have a relatively high optical absorption. Thus, to ensure that the acousto-optic material 116 has a relatively large clear aperture and is able to transmit the beam 106 without optically damaging the acousto-optic material 116, the acousto-optic material 116 has a large extent (for example, up to 1 centimeter) in a plane perpendicular to the direction of propagation of the beam 106. Because the acousto-optic material 116 is large, the acoustic wave injected into the acousto-optic material 116 has a large amount of RF acoustic power. As a result, the potential for heating of the acousto-optic material 116 in applications such as an EUV light source may be greater than in other applications.

The example provided above discusses the beam 106 having a LW infrared wavelength. However, the beam 106 may have a different wavelength. For example, the beam 106 may have a wavelength of 1.06 μm. In these implementations, the acousto-optic material 116 may be, for example, tellurium oxide ($TeO_2$), chalcogenide glass, indium phosphide (InP), or lithium niobate ($LiNbO_3$). Distortions caused by a physical effect of the acousto-optic material 116 may be compensated by adjusting the frequency content of the acoustic wave regardless of the composition of the acousto-optic material 116. In other words, the techniques for compensating for a physical effect in an optical system discussed herein are applicable to acousto-optic materials other than those that are transmissive at LW infrared wavelengths.

Additionally, because distortions of the wavefront of the beam 106 that exits the acousto-optic material 116 are estimated at the control system 164 and compensated by adjusting the frequency content of the acoustic wave, the optical system 110 does not necessarily include separate components that may otherwise be used to reduce the effects of optical interactions with the acousto-optic material. For example, the optical system 110 does not necessarily include a separate object to prevent multiple reflections of the acoustic wave from occurring in the acousto-optic material 116, such as an acoustic terminator that absorbs excess acoustic waves at the boundaries of the acousto-optic material 116. The optical system 110 also may lack a separate cooling system. Furthermore, the acousto-optic material 116 may lack a modified boundary shape (such as, for example, a notch, angled edge, or a wedge). Thus, as compared to a system that includes such separate objects and/or a modified boundary, the optical system 110 may be simpler to manufacture and maintain, uses fewer parts, and does not require modification as compared to the configuration of the system 110 used for the primary purpose. That said, the compensation techniques discussed herein may be used with an acoustic terminator, a separate cooling system, and/or other mitigating devices and/or with a material that includes a modified boundary to further improve the performance of an existing system. For example, the techniques discussed herein may be used to retrofit an existing system.

The control system 164 includes an electronic storage 166, an electronic processor 167, and an input/output interface 168. The electronic processor 167 includes one or more processors suitable for the execution of a computer program such as a general or special purpose microprocessor, and any one or more processors of any kind of digital computer. Generally, a processor receives instructions and data from a read-only memory or a random access memory or both. The electronic processor 167 may be any type of electronic processor and may include more than one electronic processor. The electronic storage 166 may be volatile memory, such as RAM, or non-volatile memory. In some implementations, the electronic storage 166 may include both non-volatile and volatile portions or components. The electronic storage 166 stores instructions, perhaps as a computer program, that, when executed, cause the processor 167 to communicate with other components in the control system 164, the optical system 110, the sensor 162 and/or the light source 102. The I/O interface 168 is any kind of electronic interface that allows the control system 164 to receive from and/or provide data and signals to an operator, the light source 102, and/or an automated process running on another electronic device. For example, the I/O interface 168 may include one or more of a visual display, a keyboard, and a communications interface.

Figure 2:
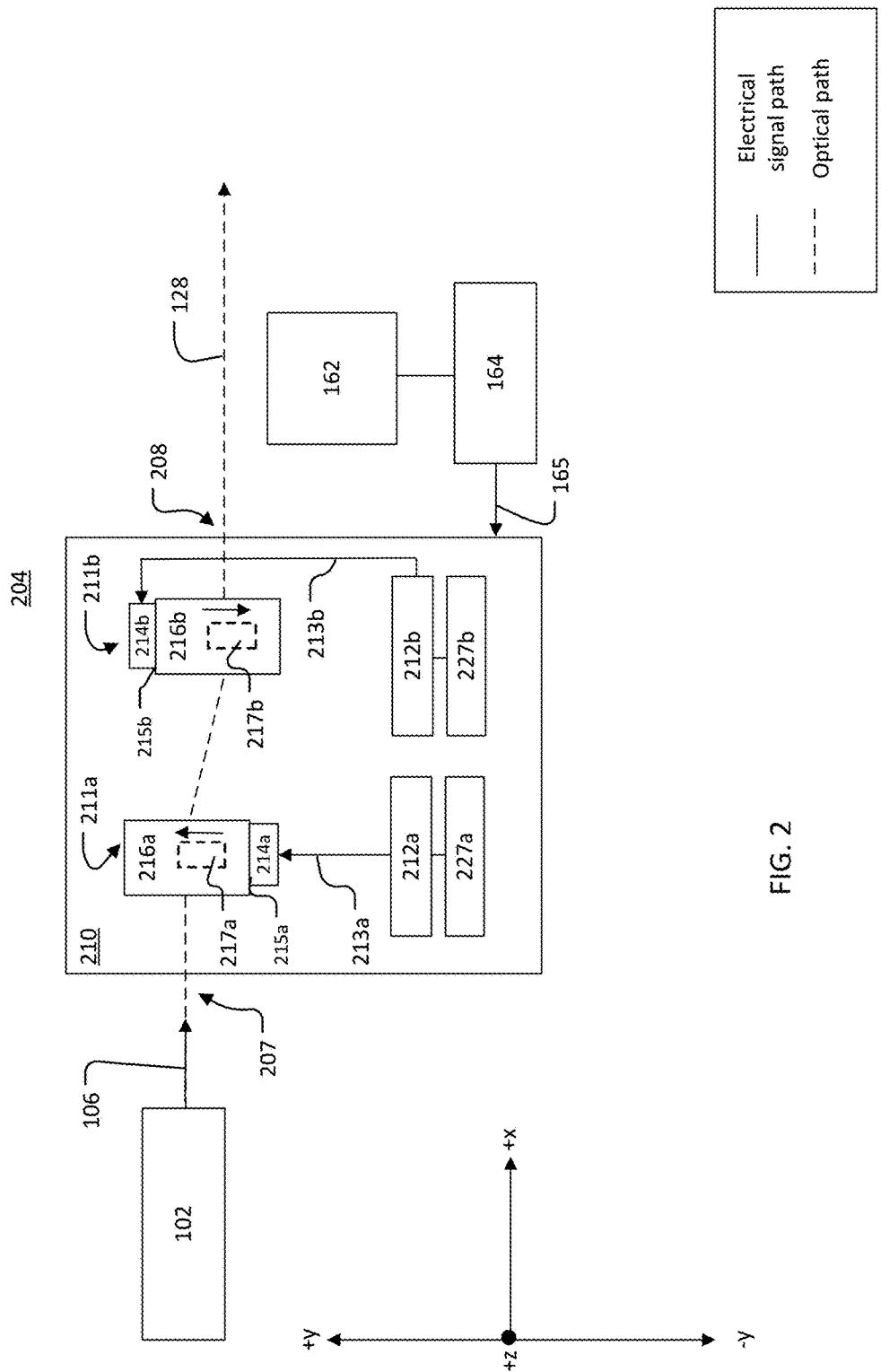

Referring to FIG. 2, a block diagram of a system 200 is shown. The system 200 is an example of an implementation of the system 100 (FIG. 1). The system 200 includes the light source 102 and an acousto-optic system 204, which receives the beam 106 at an input side 207. The system 204 includes an optical system 210, which includes radio-frequency (RF) electrical amplifiers 212a and 212b, waveform generators 227a and 227b, and acousto-optic devices 211a and 211b. The acousto-optic device 211a includes an acousto-optic material 216a and a transducer 214a at a boundary 215a. The acousto-optic device 211b includes an acousto-optic material 216b, which is attached to a transducer 214b at a boundary 215b.

The acousto-optic devices 211a, 211b are placed in series along the beam path 128. In the example shown, the acousto-optic device 211a is between the light source 102 and the acousto-optic device 211b. The beam 106 enters the optical system at a side 207, passes through the acousto-optic materials 216a and 216b, and exits the optical system at a side 208. As discussed above, the acousto-optic devices 211a, 211b are present in the system to deflect light onto or away from a beam path, and the deflection is achieved by injecting a constant frequency acoustic wave into the acousto-optic materials 216a, 216b. The constant frequency acoustic wave generates a transient diffractive element 217a, 217b in the respective acousto-optic material 216a, 216b. Due to physical effects in the acousto-optic materials 216a and 216b, the wavefront of the beam 106 that exits at the side 208 may become distorted. To compensate for the distortion, the transient diffractive elements 217a, 217b are modified, for example, the transient diffractive elements 217a, 217b may be modified by injecting a chirped-frequency acoustic wave into the materials 216a, 216b instead of or in addition to the constant frequency acoustic wave. The diffraction properties of the elements 217a, 217b (as modified or produced based on the chirped-frequency acoustic wave) are such that an interaction between the light beam 106 and the elements 217a and/or 217b removes or mitigates the wavefront distortion.

The wavefront of the beam 106 on the side 207 (after passing through the materials 216a and 216b) is estimated by the control system 164 based on information from the sensor 162. The control system 164 determines a corrective phase pattern, that, if applied to the beam 106, would remove or mitigate the wavefront distortion. The control system 164 also determines frequency characteristics of an acoustic wave that, if present in the acousto-optic material 216a and/or 216b as the respective diffractive element 217a, 217b when the beam 106 passes through the material, would impart the corrective phase pattern onto the beam 106 to remove or mitigate the wavefront distortion.

The transducers 214a, 214b are coupled to respective RF amplifiers 212a, 212b, which provide respective electrical signals 213a, 213b. The transducers 214a and 214b convert the electrical signals 213a and 213b into acoustic waves that are coupled into the respective acousto-optic materials 216a, 216a. The frequency content of the generated acoustic waves depends on the frequency content of the electrical signals 213a, 213b. In the example shown, the transducer 214a is connected to the acousto-optic material 216a at the boundary 215a, and the transducer 214b is connected to the acousto-optic material 216b at the boundary 215b. The boundary 215a is the lower side boundary (in the direction −y relative to the center of the material 216a), and the boundary 215b is the upper side boundary (in the direction +y relative to the center of the material 216b). Placing the transducers 214a, 214b at opposite ends of the respective acousto-optic material 216a, 216b results in the acoustic waves generated by the transducers 214a, 214b propagating in opposite directions. In the example of FIG. 2, the acoustic wave generated by the transducer 214a propagates in the +y direction, and the acoustic wave generated by the transducer 214b propagates in the −y direction.

The acoustic wave generated by the transducer 214a creates the transient diffractive element 217a, which propagates in the acousto-optic material 216a the +y direction, and the acoustic wave generated by the transducer 214b creates a transient diffractive element 217b, which propagates in the acousto-optic material 216b in the −y direction. The diffractive properties of the transient diffractive elements 217a, 217b are determined by the frequency content of the acoustic wave. By controlling the frequency content of the acoustic wave, the phase profile or phase pattern of the optical system 210 also may be controlled. The phase profile or phase pattern of the optical system 210 is the phase imparted onto the beam 106 in the y-z plane due to the beam passing through the acousto-optic materials 216a, 216b. For example, to cause the acousto-optic materials 216a and 216b to act collectively as a converging diffractive lens, the RF electrical signal 213a has a linearly chirped frequency, and the RF electrical signal 213b is the same linearly chirped frequency but is 180 degrees (°) out of phase. Other phase profiles may be achieved by adjusting the frequency content of the RF electrical signals 213a, 213b.

Continuing with the example in which the acousto-optic materials 216a and 216b act collectively as a converging diffractive lens, when the beam 106 exits the acousto-optic material 216a after interacting with the transient diffractive element 217a, the beam 106 is diffracted according to a diffraction pattern that depends on the frequency content of the acoustic wave that created the transient diffractive element 217a. The beam 106 propagates in a direction of propagation (the +x direction in this example) when the beam 106 impinges on the material 216a, and the transient diffractive element 217a diffracts the beam 106 at an angle relative to the +x direction. Because the frequency of the acoustic wave that created the transient diffractive element 217a varies in time, the angle at which light is deflected at a particular location of the material 216a also may vary as the transient diffractive element 217a moves through the material 216a. Thus, the angle at which the beam 106 is deflected by the diffractive element 217a is time dependent.

To counteract the temporal dependence of the deflection angle, an acoustic wave propagates in the acousto-optic material 216b in the opposite direction (the −y direction) and is 180° out of phase with the acoustic wave that propagates in the material 216a. Because the transient diffractive element 217b propagates in the opposite direction as the transient diffractive element 217a, the transient diffractive element 217b deflects the beam 106 the same amount as the transient diffractive element 217a but in the opposite direction relative to the +x direction. Thus, the time-dependence of the deflection is compensated, and the beam 106 exits the material 216b in the +x direction.

After exiting from the acousto-optic material 216b, the beam 106 is displaced in the −y direction compared to the position of the beam 106 prior to entering the acousto-optic material 216a. The displacement arises because of the spatial distance that the beam 106 travels after being deflected by the transient diffractive element 217a. The amount of displacement is determined by the angle of deflection and the separation of the acousto-optic materials 216a and 216b.

In the example of FIG. 2, the optical system 210 includes a single pair of acousto-optic devices (the acousto-optic devices 211a and 211b). As discussed above, the acousto-optic devices impart a phase pattern onto the beam 106. Each of the acousto-optic devices 211a, 211b may apply a phase pattern that causes the beam to converge or diverge in the same dimension. For example, the diffractive characteristics of the transient diffractive element 217a may cause the beam 106 to diverge in the y dimension after the beam 106 passes through the acousto-optic device 211a, and the diffractive characteristics of the transient diffractive element 217b may cause the beam 106 (which is diverging from passing through the acousto-optic device 211a) to converge in the y dimension after passing through the acousto-optic device 211b. Thus, such a pair of acousto-optic devices may be configured to act as a cylindrical lens.

Other implementations of the optical system 210 are possible. For example, the optical system 210 may include a pair of orthogonal or perpendicularly crossed acousto-optic devices that are used to shape the wavefront of the beam 106 in two dimensions. In these implementations, the diffractive characteristics of the transient diffractive element 217a may cause the beam 106 to diverge in the y dimension, and the transient diffractive element 217b may cause the beam 106 (which is diverging after passing through the acousto-optic device 211a) to converge in the z dimension. Thus, a pair of orthogonal acousto-optic devices may be used to modulate the amplitude and/or phase of the beam 106 in two dimensions. A single orthogonal pair of acousto-optic devices (where one acousto-optic device is orthogonal to the other acousto-optic device of the pair) may be used in an implementation in which the laser pulse duration is short compared to the distance that the transient diffractive element travels in the acousto-optic material.

Moreover, in some implementations, the optical system 210 includes a different number of acousto-optic devices than shown in FIG. 2. For example, the optical system 210 may include more than one acousto-optic systems 204 positioned in series on the path 128. In other words, the optical system 210 may include more than one pair of acousto-optic devices (that is, the optical system 210 may include more than two acousto-optic devices). In these implementations, the total phase pattern imparted on the beam 106 by all of the acousto-optic devices is the sum of the phase pattern imparted by each pair. For example, orthogonal pairs (for example, a first group of two acousto-optic devices that are parallel to each other and a second group of two acousto-optic devices that are orthogonal to the first group) may be configured to act as a spherical lens. In implementations in which the laser pulse duration is large relative to the distance that the transient diffractive element travels in the acousto-optic material, two pairs of orthogonal acousto-optic devices may be used (for example, one pair in the x-y plane and one pair in the y-z plane). Furthermore, in some implementations, the optical system 210 may include pairs of acousto-optic devices that are arranged in other configurations. For example, the optical system 210 may include three pairs of acousto-optic devices, with the first pair including two acousto-optic devices that are parallel to each other, the second pair being oriented at 45° relative to the first pair, and the third pair being orthogonal to the first pair. The optical system 210 may include more than three pairs of acousto-optic devices, and each pair may be oriented in any manner relative to the others. For example, the optical system 210 may include four, five, or six pairs of acousto-optic devices, or more than six pairs of acousto-optic devices.

Each acousto-optic device may be connected to a separate RF amplifier and a separate waveform generator such that each acousto-optic device may receive a different RF electrical signal. Thus, the phase pattern of each acousto-optic device may be individually controlled and adapted to provide the compensation needed for a particular situation. Further, in some implementations, the optic system 210 includes just a single acousto-optic device.

Figure 3:
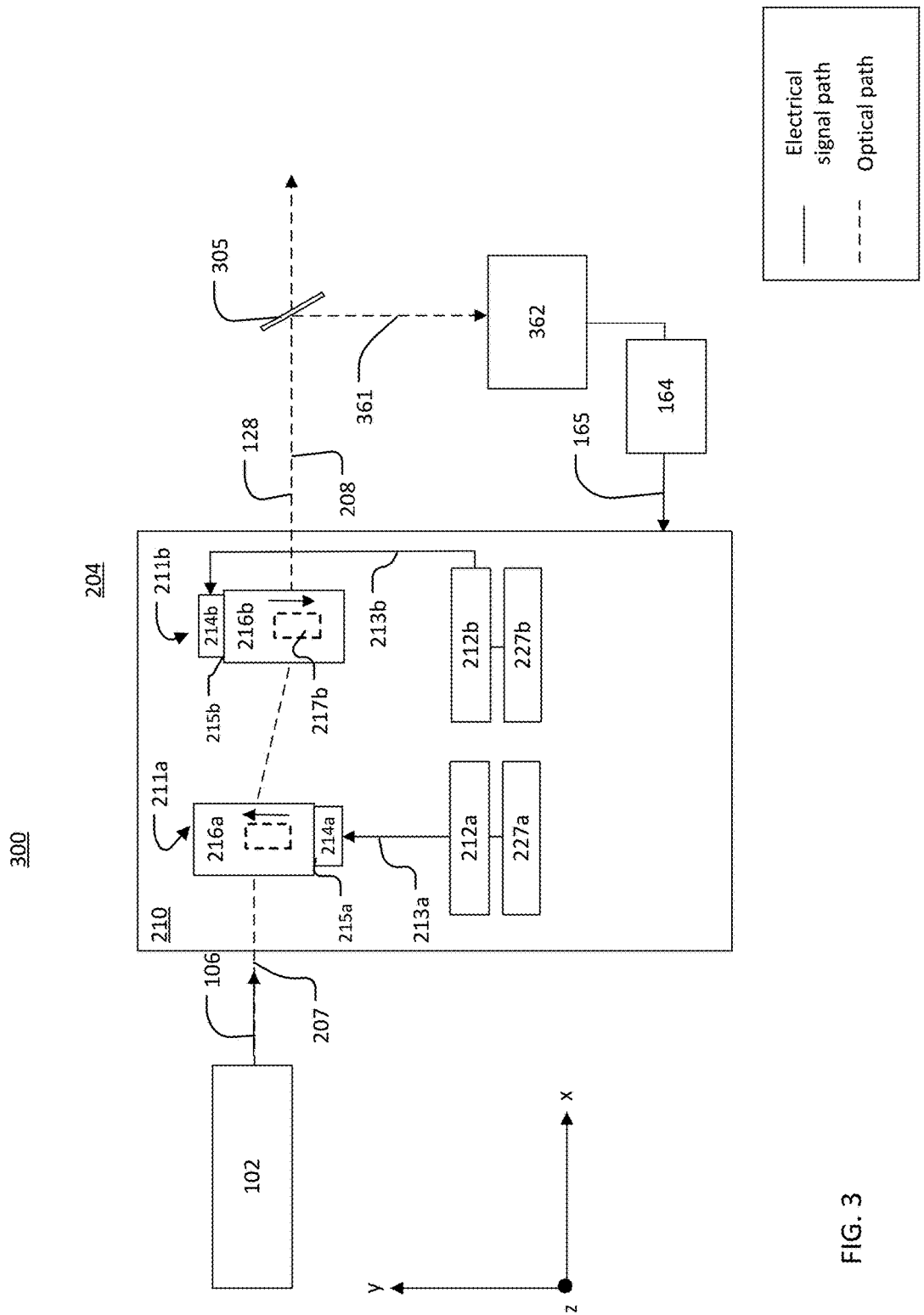

Referring to FIG. 3, a block diagram of another example system 300 is shown. The system 300 is another example implementation of the system 100 (FIG. 1). The system 300 includes the acousto-optic system 204, discussed above with respect to FIG. 2. In the implementation shown in FIG. 3, after passing through the acousto-optic materials 216a, 216b, the beam 106 interacts with an optical divider 305 (such as, for example, a beam splitter) that transmits a portion 361 of the beam 106 a wavefront sensor 362. The wavefront sensor 362 may be, for example, a graded phase mask, a wavefront sensing camera, or an interferometer. The wavefront sensor 362 provides data representative of the wavefront of the portion 361 to the control system 164. The control system 164 analyzes the data and estimates the wavefront of the portion 361. The control system 164 generates the control signal 165 based on the estimated wavefront of the portion 161 and provides the control signal 165 to the waveform generators 227a and 227b. Each waveform generator 227a, 227b generates a chirped electrical signal with a frequency content that is indicated by the control signal 165. The control signal 165 may include a separate control signal for each waveform generator 227a and 227b, such that the waveform generators 227a, 227b may generate electrical signals having different frequency characteristics. The chirped electrical signal is amplified in the respective RF amplifier 212a, 212b to form the amplified electrical signals 213a, 213b. The electrical signals 213a, 213b are provided to the respective transducers 214a, 214b, which convert the signals 213a, 213b to acoustic waves that are injected into the respective acousto-optic material 216a, 216b at the respective boundaries 215a, 215b.

Thus, the electrical signals 213a and 213b are chirped-frequency signals having a frequency content that is based on an estimate of a wavefront the beam 106 at the output side 208 (after the beam 106 has passed through the materials 216a and 216b). Because the diffraction pattern imparted by the transient diffractive elements 217a and 217b depends on the frequency of the acoustic wave, controlling the frequency content of the electrical signals 213a and 213b (for example, by controlling the waveform generators 227a to 227b with the control signal 165) allows control of the diffraction pattern imparted by the materials 216a and 216b. This allows distortions in the wavefront of the beam 106 to be corrected, intentionally adjusted, or mitigated. For example, distortions caused by a physical effect in the acousto-optic materials 216a and/or 216b (such as heating that causes changes in the index of refraction of either or both of the materials 216a and 216b) may be corrected or mitigated.

Figure 4A:
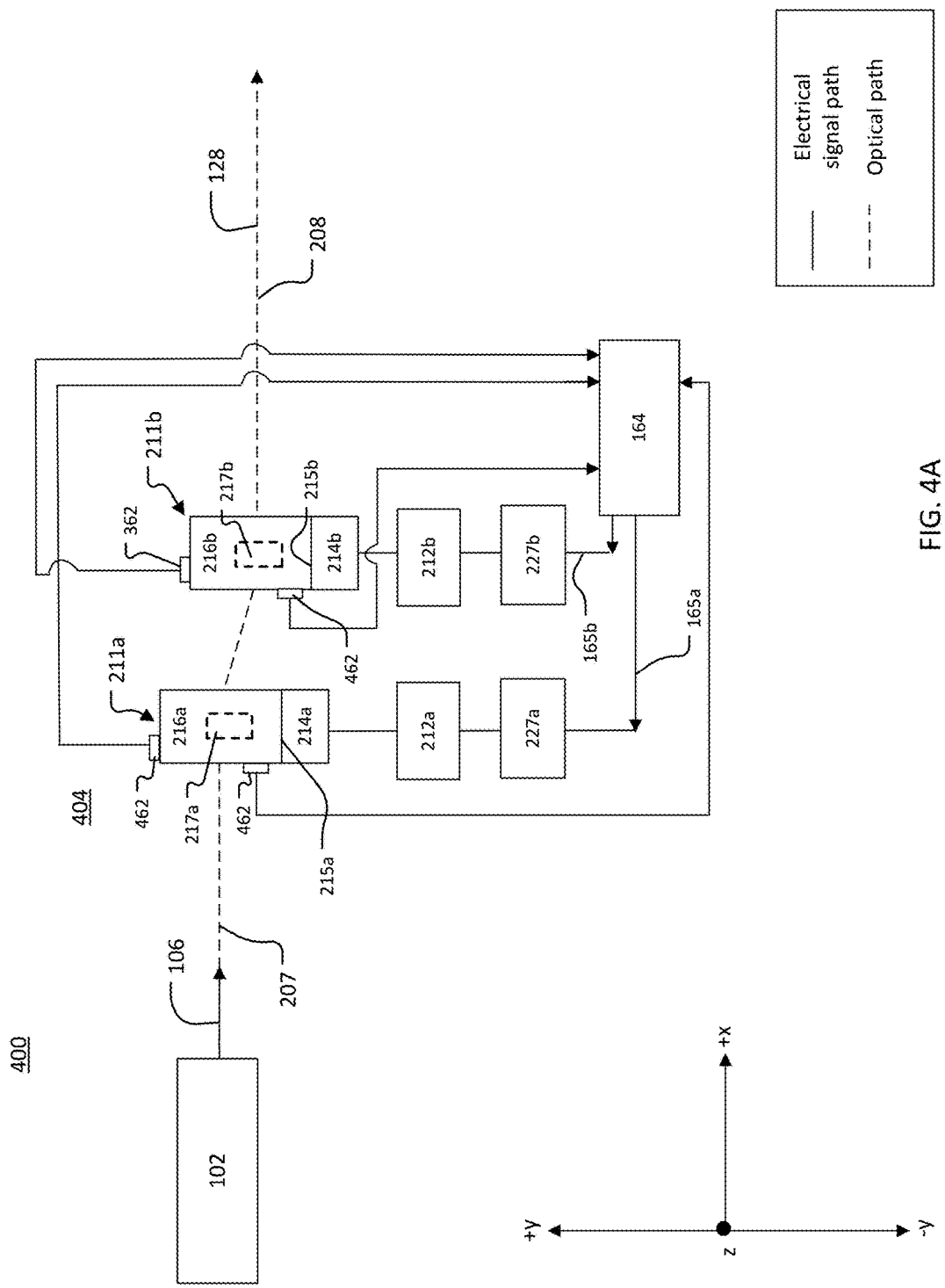
FIG. 4B is a block diagram of an exemplary arrangement of thermal sensors on an acousto-optic material of the acousto-optic system of FIG. 4A.

FIG. 4A is a block diagram of a system 400, which is another example of an implementation of the system 100 of FIG. 1. The system 400 differs from the system 300 (FIG. 3) in that the system 400 does not include the optical divider 305 or the wavefront sensor 362. The system 400 includes an acousto-optic system 404, which includes the acousto-optic devices 211a, 211b. Instead of estimating the wavefront of the beam 106 with the wavefront sensor 362, the acousto-optic system 404 estimates the wavefront of the beam 106 by estimating a spatial temperature distribution of the acousto-optic materials 216a and 216b. The temperature distribution may be, for example, the temperature change from one point on the material to another point. The system 404 includes temperature sensors 462, which are placed on the acousto-optic materials 216a and 216b. The temperature sensors 462 may be, for example, thermocouples and/or resistive thermometers.

Figure 4B:
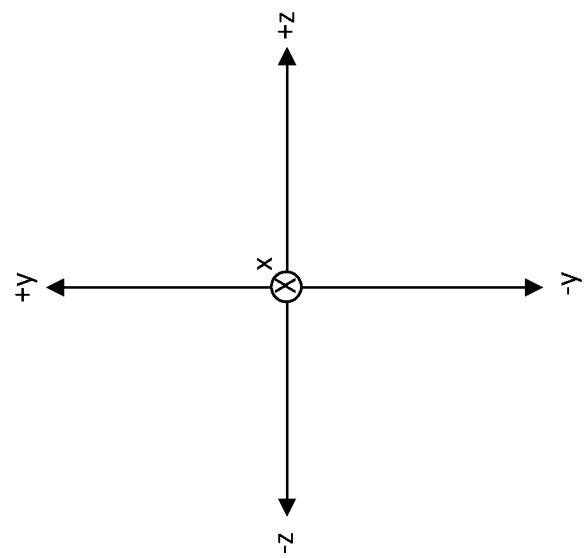
Figure 4B:
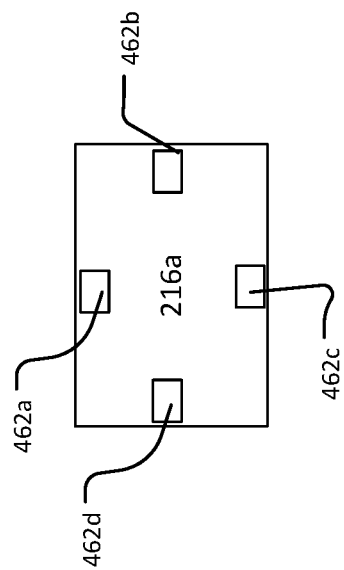

In the example of FIG. 4A, each of the temperature sensors 462 are placed at a different boundary of each acousto-optic material 216a and 216b. Referring also to FIG. 4B, an example of how the sensors 462 may be positioned at the acousto-optic material 216a is shown. FIG. 4B shows four instances of the sensor 462, labeled as sensors 462a-462d. The sensors 462a-462d are presented for illustration purposes. In other implementations, more or fewer sensors may be used. In the example of FIGS. 4A and 4B, the sensors 462a-462d are positioned at four different locations at or near the perimeter of the acousto-optic material 216a, with the sensor 462a at the upper side boundary (in the +y direction from a center of the material 216a), the sensor 462b at the right boundary (in the direction +z relative to the center of the material 216a, the sensor 462c at the lower boundary (in the direction −y relative to the center of the material 216a), and the sensor 462d at the left boundary (in the direction −z relative to the center of the material 216a). In other implementations, the sensors may be positioned in different locations.

The temperature measurements from each sensor 462a-462d is provided to the control system 164. As discussed in greater detail with respect to FIG. 5, the control system 164 may implement a model that estimates the temperature distribution throughout the acousto-optic materials 216a and 216b based on the temperatures measured at the boundary of the acousto-optic materials 216a and 216b.

Figure 5:
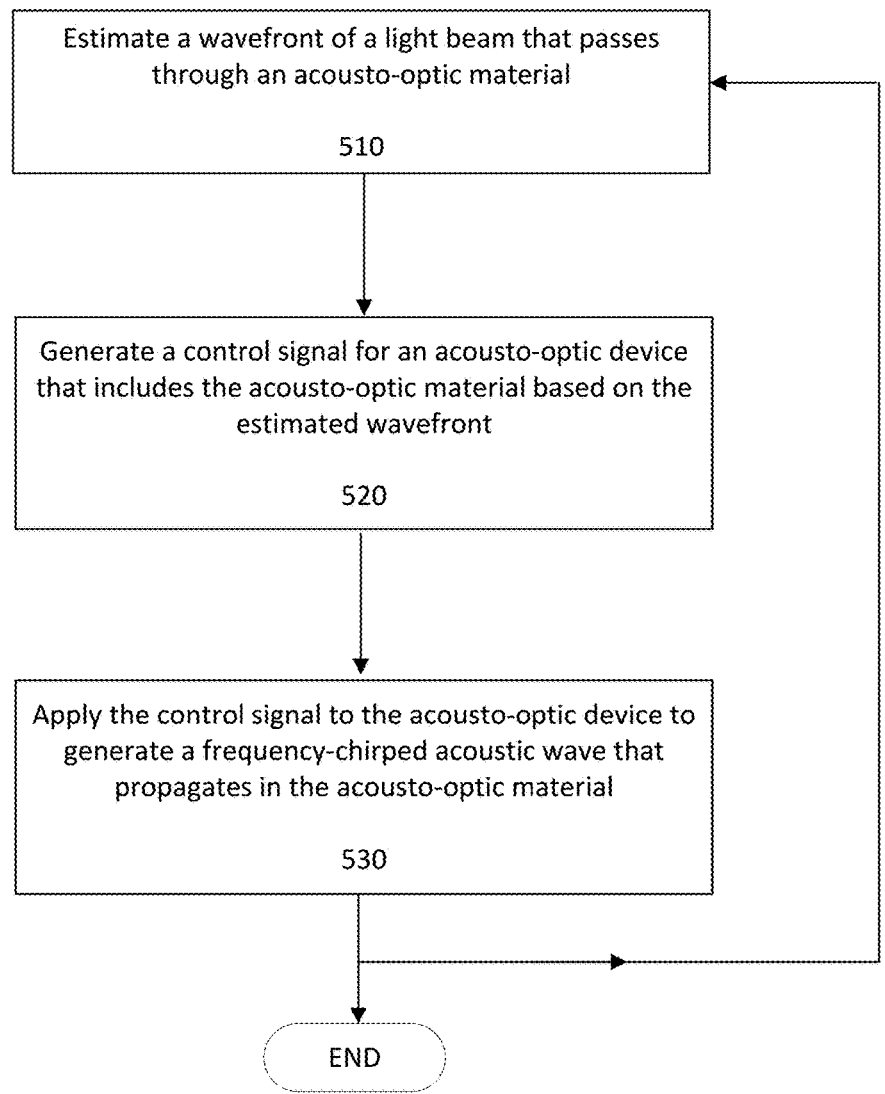
FIG. 5 is a flow chart of an exemplary process for compensating for a physical effect in an acousto-optic material.

Referring to FIG. 5, a flow chart of an exemplary process 500 for compensating for a physical effect in an optical system is shown. For example, the process 500 may be used to compensate for a distortion of a wavefront of a beam that passes through and exits an acousto-optic material, where the distortion arises completely or in part from a physical effect in the acousto-optic material. The process 500 may be implemented by the electronic processor 167 of the control system 164 and may be used with any of the systems 104, 204, and 404 discussed above. For illustration, the process 500 is discussed with respect to an acousto-optic device 111 and associated components (shown in FIGS. 6A and 7A). The process 500 may be applied to more than one acousto-optic device 111. The acousto-optic device 111 may be any or all acousto-optic devices included in any of the systems 104, 204, and 404. For illustration purposes, the process 500 is discussed with respect to FIGS. 5, 6A-6C, 7A, and 7B.

Figure 6A:
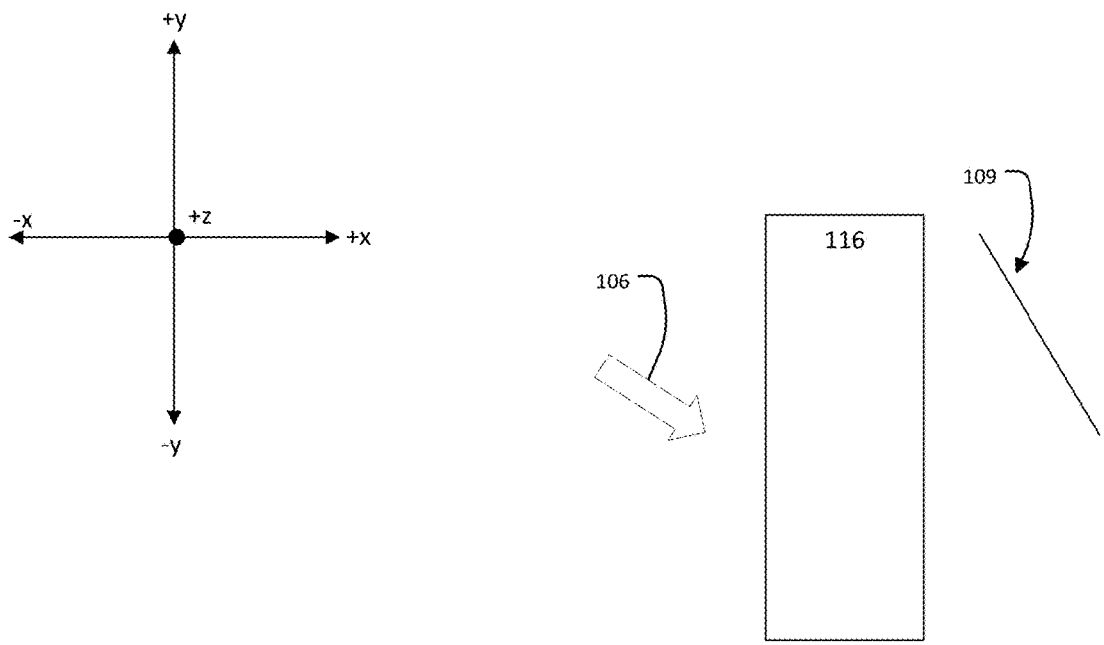
FIGS. 6A-6C show an example of a physical effect in an acousto-optic material.
Figure 7A:
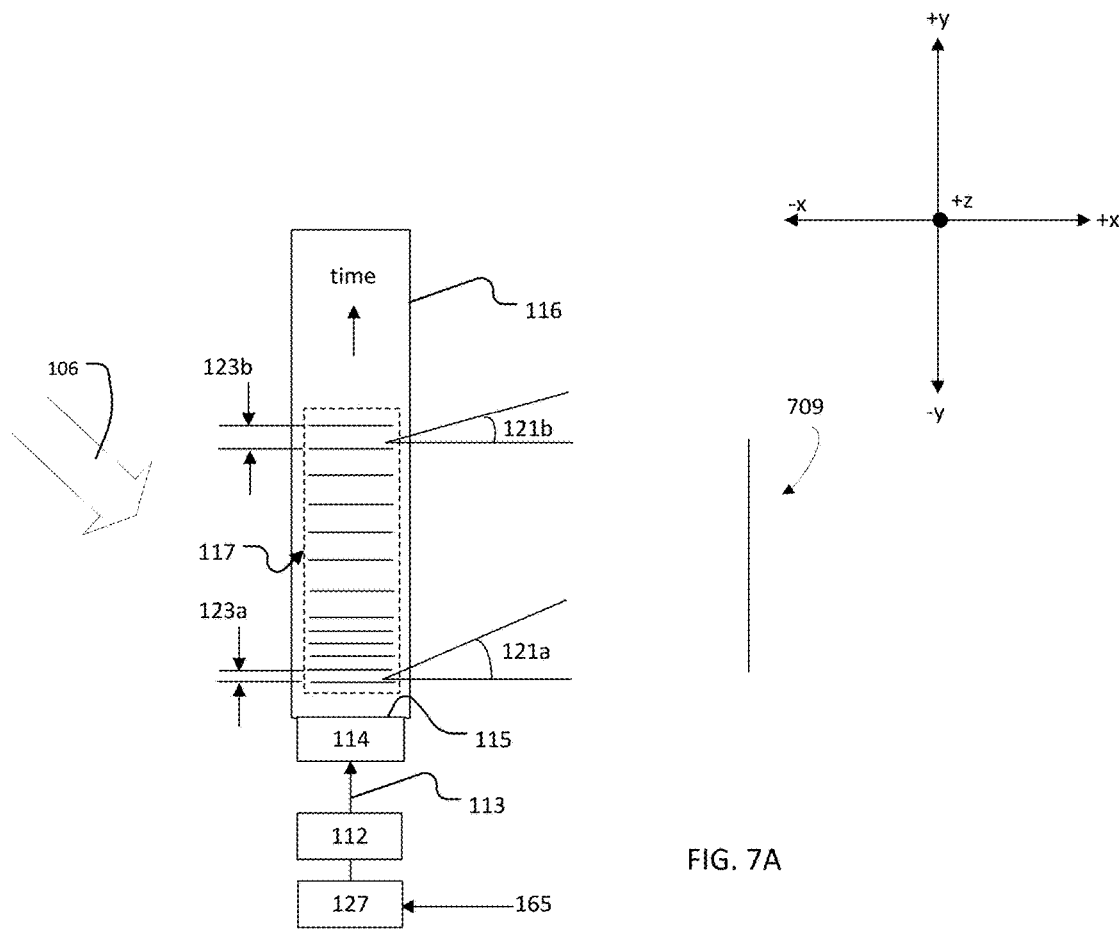
FIG. 7A is a block diagram of an acousto-optic material with an exemplary transient diffractive element.

In the process 500, a wavefront of the light beam 106 is estimated after the beam 106 passes through the acousto-optic material 116, shown in FIGS. 6A and 7A (510). The wavefront of the light beam 106 may have an unintentional distortion caused by a physical effect in the acousto-optic material. The estimate of the wavefront includes an indication of the distortion. A control signal for the acousto-optic device 111 is generated based on the estimated wavefront (520), and the control signal is applied to the acousto-optic device to generate a frequency-chirped acoustic wave that propagates in the acousto-optic material 116 (530). The frequency-chirped acoustic wave forms a transient diffractive element 117 in the material 116, and an interaction between the beam 106 and the transient diffractive element 117 corrects or mitigates for the wavefront distortion. The components of the process 500 are discussed in more detail below. The process 500 may be a continuous feedback-like process that continuously estimates the wavefront of the light beam and applies various control signals to the acousto-optic device (for example, as indicated by the line flowing from (530) to (510) in FIG. 5). In some implementations, the process 500 may be performed at pre-set intervals in time, the process 500 may be performed once (for example, by performing (510), (520), and (530) and then ending the process 500), or the process 500 may be performed on-demand.

Figure 6B:
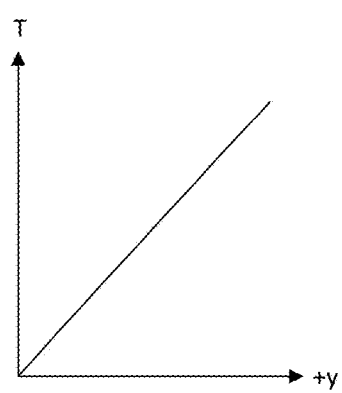
Figure 6C:
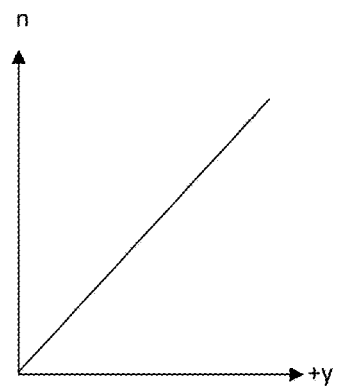

A wavefront of a light beam that passes through and exits the acousto-optic material 116 is estimated (510). As noted above, the wavefront may be estimated based on data from a sensor that measures the wavefront (such as the sensor 362 of FIG. 3) or by estimating a temperature of the acousto-optic material (such as with the sensors 462 of FIG. 4A). Referring also to FIG. 3, the wavefront of the light beam 106 may be estimated from data provided by the wavefront sensor 362. As noted above, physical effects in the acousto-optic material 116 may distort the wavefront. Referring also to FIGS. 6A-6C, an example of a wavefront distortion caused by a physical effect in the acousto-optic material 116 is shown. In the example of FIGS. 6A-6C, the temperature of the acousto-optic material 116 varies as a function of position along the y dimension (the dimension that includes the +y and −y directions). FIG. 6B shows a plot of the temperature of the material 116 as a function of position in the material 116 in the +y direction. As shown in FIG. 6B, the temperature of the material increases linearly as a function of position in the +y direction. In this example, the material 116 has a constant thermal optic coefficient (dn/dT), thus, the index of refraction (n) of the material 116 also increases linearly as a function of position in the +y direction, as shown in FIG. 6C.

The optical path length of the acousto-optic material 116 depends on the index of refraction of the material 116 as shown in Equation (1):

$$\text{OPL} = \int_0^d n(x)\,dx \qquad \text{Equation (1),}$$

where OPL is the optical path length, n is the index of refraction, and d is the geometric path of the ray in the material 116 Because the index of refraction varies spatially in the acousto-optic material 116, there is a corresponding spatial variation of the optical path length within the material 116. As a result, the wavefront of the beam 106 is distorted by the acousto-optic material 116. In the example of FIG. 6A, the wavefront of the beam 106 becomes a tilted wavefront 109 after passing through the material 116. The wavefront 109 is tilted because the portions of the beam 106 that pass through the lower index of refraction regions of the material 116 reach a point in space before the portions of the beam that pass through the higher index of refraction regions reach that same point in space. In the absence of the physical effect in the material 116, the wavefront 109 would be flat (in the example of FIG. 6A, a flat wavefront is one that extends along the y dimension without a tilt). Referring again to FIG. 5 (510), the wavefront 109 is measured by the wavefront sensor 362, and data representing the measured wavefront is provided to the control system 164.

In some implementations, the wavefront is estimated from data obtained by a temperature sensor, such as the temperature sensors 462a-462d of FIG. 4B. The data from the temperature sensors 462a-462d is analyzed by the control system 164 to determine an estimate of the temperature distribution throughout the acousto-optic material 116. As discussed with respect to FIGS. 4A and 4B, the sensors 462a-462d are at various locations or boundaries (for example, various outer perimeters or edges) of the acousto-optic material 116. The electronic storage 166 of the control system 164 may store information that defines a model that predicts the temperature throughout the acousto-optic material 116 based on the measured boundary temperatures received from the sensors 462a-462d. The model may be based on, for example the heat equation, which estimates temperature distributions over time in a three-dimensional space (including in a solid). The heat equation for a three-dimensional rectangular block of material (for example, the acousto-optic material 116) is shown as Equation (2):

$$\rho c \frac{\partial T}{\partial t} - \nabla \cdot (k \nabla T) = \dot{q},$$  Equation (2)

where T is temperature, $\nabla$ is the vector differential operator, $\rho$ is the mass density of the acousto-optic material 116, k is the thermal conductivity, c is the specific heat capacity of the material, and $\dot{q}$ is the volumetric heat flux in the material. The volumetric heat flux in the acousto-optic material 116 may be, for example, heat that arises from absorption of acoustic and/or optical energy.

As discussed above, the beam 106 may be a LW infrared light beam, and materials suitable for use with LW infrared light may be particularly prone to heat absorption. Using the measured temperatures, a model of the temperature distribution in the acousto-optic material 116 may be obtained from Equation (2). An estimate of the spatial variation in the index of refraction of the acousto-optic material 116 may be determined from the temperature distribution and the thermal optic coefficient (dn/dT) of the material. The estimate of the wavefront may be determined from the estimated spatial variation of the index of refraction.

A control signal 165 for the optical system 110 is generated based on the estimate of the wavefront (520). The control signal 165 includes data and/or information that is sufficient to generate a frequency-chirped acoustic wave that is injected into the acousto-optic material 116 to form the transient diffractive element 117. For example, the control signal 165 may be an electrical signal that is delivered to an input interface of the waveform generator 127 with information that informs the waveform generator 127 of the frequency content, temporal duration, and/or amplitude of an electrical signal to be formed by the waveform generator. To generate the control signal 165, the control system 164 may compare the estimated wavefront to a reference wavefront. The reference wavefront may be a flat wavefront. The estimated wavefront and the reference wavefront may be compared, for example, numerically such as by a subtraction.

In some implementations, the waveform generator 127 and/or the control system 164 may store control signals that are sufficient to generate frequency-chirped acoustic waves that compensate for recurring or expected physical effects. In these implementations, the control signal 165 is generated by comparing the estimated wavefront to a reference wavefront and determining which of a plurality of pre-existing and stored control signals is associated most closely with the thermal distortion that produced the estimated wavefront.

The control signal 165 may be used to control the injection of an acoustic wave into the acousto-optic material 116 for purposes other than correction of a thermal distortion arising from a physical effect in the acousto-optic material. For example, in some implementations, even if the estimated wavefront and the reference wavefront are substantially the same, the control signal 165 is generated but without data or information related to the generation of a frequency-chirped acoustic wave. In some implementations, if the estimated wavefront is substantially the same as the reference wavefront, the control signal 165 is not generated.

The control signal 165 is applied to the optical system 110 to generate a frequency-chirped acoustic wave that propagates in the acousto-optic material 116 (530). When the acoustic wave propagates in the acousto-optic material 116, the transient diffractive element 117 is formed. The data and/or information in the control signal 165 is based on the estimate of the wavefront and/or the difference between the estimated wavefront and the reference wavefront. Thus, the frequency content of the acoustic wave (which is specified from the data and/or information in the control signal 165) determines the spacing of the regions of compression and expansion in the material 116.

Figure 7B:
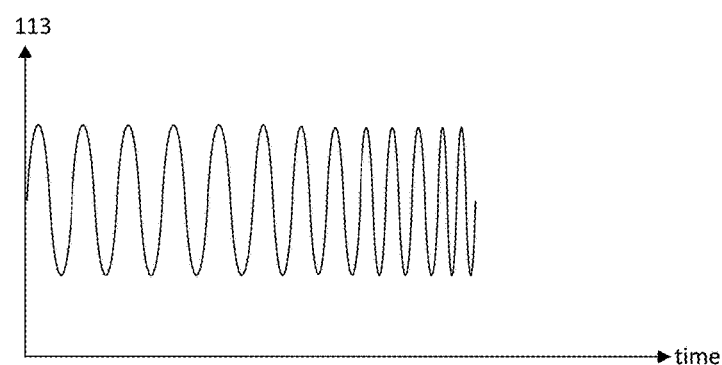
FIG. 7B is a plot of an exemplary frequency-chirped signal that is applied to the acousto-optic material of FIG. 7A.

Continuing with the example discussed above and shown in FIG. 6A, in which the wavefront is tilted due to a physical effect in the acousto-optic material 116, FIGS. 7A and 7B show an example of compensating for the physical effect. FIG. 7A is a schematic representation of the acousto-optic material 116 at an instance in time when the transient diffractive element 117 is formed in the material 116. FIG. 7B is a plot of the electrical signal 113 used to drive the transducer 114 to generate the diffractive element 117 as a function of time. The frequency of the electrical signal 113 varies over time, with the frequency being lower at earlier parts of the signal 113 (toward the left in FIG. 7B) than at the later parts of the signal (toward the right in FIG. 7B). The frequencies in the signal 113 may be, for example, tens of megahertz (MHz), 40 MHz, 60 MHz, 20-100 MHz, or between 1 MHz and 1 gigahertz (GHz).

The electrical signal 113 may be amplified by the electrical amplifier 112 prior to being provided to the transducer 114. The amplified electrical signal may have a power of, for example, 20-100 W. The transducer 114 converts the electrical signal 113 into an acoustic wave that is coupled into the acousto-optic material 116 through physical contact between the transducer 114 and the material 116 at the boundary 115. The frequency of the acoustic wave is proportional and/or equal to the frequency of the electrical signal 113. The portions of the electrical signal 113 that occur first in time are applied first to the transducer 114, thus the lower frequency portions of the acoustic wave enter the material 116 first and propagate in the material 116 in the +y direction before the higher frequency portion. The acoustic wave forms the transient diffractive element 117 moves in the +y direction through the material 116. In the example of FIG. 7A, lines that extend along the x dimension in the region labeled 117 represent the distances between regions of compression and expansion within the material 116 that arise from the acoustic wave traveling through the material. The distance between the regions of compression and expansion of the transient diffractive element 117 depends on the frequency of the acoustic wave. Distances 123a, 123b are respective exemplary distances between regions of compression and expansion in the higher frequency portion of the acoustic wave and the lower frequency portion of the acoustic wave. Light that interacts with the transient diffractive element 117 is diffracted at an angle that depends on the wavelength of the acoustic wave (which is inversely proportional to the frequency of the acoustic wave), as shown in Equation (3):

$$\sin\theta = \frac{m\lambda}{\Lambda},$$  Equation (3)

where m is the order of diffraction and equals . . . −2, −1, 0, 1, 2 . . . ; Λ is the wavelength of the acoustic wave; and λ is the wavelength of the light incident on the acousto-optic material 116. The diffraction angle θ increases as the frequency of the acoustic wave increases (or as the wavelength of the acoustic wave decreases). In the example of FIG. 7A, light interacting with the transient diffractive element 117 at a portion of the element 117 that has a spacing such as the distance 123*a* is diffracted at an angle 121*a*. Light interacting with the transient diffractive element 117 at a portion of the element 117 that has a spacing such as the distance 123*b* is diffracted at an angle 121*b*. The distance 123*a* is smaller than the distance 123*b*, thus, the angle 121*a* is larger than the angle 121*b*.

At the instant at which the beam 106 is incident on the material 116, the transient diffractive element 117 is located in the material 116 as shown in FIG. 7A. The beam 106 interacts with the diffractive element and is diffracted at an angle that depends on the distance between the regions of compression and expansion. Accordingly, in the example of FIG. 7A, portions of the beam 106 that interact with a portion of the diffractive element 117 closer to the transducer are diffracted at a higher angle than portions of the beam 106 that interact with the transient diffractive element 117 further (in the +y direction) from the transducer 114. As a result of the different amounts of diffraction, the tilt 109 of the wavefront (shown in FIG. 6A) is removed. The beam that emerges from the acousto-optic material 116 has a flat wavefront 709.

The amount of time that the transient diffractive element 117 is present in the acousto-optic material 116 depends upon the speed of sound in the material 116, the duration of the exciting signal 113, and the extent of the material 116 along the y dimension (the dimension that includes the +y and −y directions). The beam 106 may be a pulsed light beam, and each pulse may have a temporal duration of, for example, 100 nanoseconds (ns) or less. For a Ge or GaAs acousto-optic material 116, the transient diffractive element 117 may travel 500 microns (μm) or less in the material 116 while the pulse interacts with the transient diffractive element 117. As noted above, the aperture of the material 116 in the y-z plane may be 1 cm, which is much greater than 500 μm and which is also much greater than the distance between the regions of compression and expansion caused by the strain wave. Thus, although the transient diffractive element 117 is not permanent, the diffractive element 117 does not change appreciatively while the pulse of light interacts with the element 117. In this way, the transient diffractive element 117 may be modified while the optical system 110 is in use to compensate for changing physical effects but is sufficiently stable to shape and correct the wavefront of each single pulse that interacts with the element 117.

The process 500 also may be used to compensate for physical effects in optical elements in other parts of the system 100. For example, in implementations that use a wavefront sensor (such as the wavefront sensor 362 of FIG. 3) to measure the wavefront of the beam that exits the acousto-optic material, the measured wavefront may include distortions caused by elements other than the acousto-optic material. Thus, by estimating the wavefront of the beam 106 after the beam 106 passes through the acousto-optic material 116, effects on the wavefront caused by optical elements, such as, for example, lenses and mirrors, with which the beam 106 interacted before passing through the material 116 also may be reflected in the distorted wavefront. Distortions caused by other elements also may be corrected in addition to distortions caused by the acousto-optic material 116 itself.

As noted above, the process 500 may be implemented as a feedback-loop control. For example, the acousto-optic material 116 may initially lack acoustic heating that can cause wavefront distortion. For example, initially there may be no acoustic wave that propagates in the material 116. An initial constant frequency acoustic wave may be applied to the material (for example, to cause the material 116 to deflect light). The generation of the initial constant frequency acoustic wave results in heating that causes a distortion in a wavefront of a light beam that passes through the material 116. The distortion is measured (for example, at 510 of FIG. 5), and a control signal is generated (for example, at 520 of FIG. 5). The control signal is applied to an acousto-optic device that includes the material 116 to generate a frequency chirped acoustic wave that propagates in the material 116 to form a transient diffractive element (for example, at 530 of FIG. 5). The frequency chirped acoustic wave may be generated by modifying the initial constant frequency acoustic wave. Light passing through the material 116 is corrected for the wavefront distortion that arises from the generation of the initial constant frequency acoustic wave through an interaction with the transient diffractive element formed from the frequency chirped acoustic wave. However, that modification of the frequency content may cause a slightly different distortion, and/or a different amount of heating without reaching thermal equilibrium. Thus, the process 500 may be repeated such that the wavefront of the light beam is again measured and a further modified correction in the form of a subsequent modified acoustic wave may be applied to the material 116. The process 500 may continue to be applied until a steady state is reached.

The chirped-frequency electrical signal 113 of FIG. 7B is shown as an example. Other electrical signals having different frequency content to compensate for different distortions may be generated. For example, as discussed by Akemann et al., "Fast spatial beam shaping by acousto-optic diffraction for 3D non-linear microscopy," Optics Express, 19 Oct. 2015, Vol. 23, No. 22, pp. 28191-28205, for a single acousto-optic device, an acoustic wave that has a frequency that changes at N positions $y_i$ (with i=1 to N along the +y direction of the acousto-optic material of the device), the frequencies of an acoustic wave applied between $y_i$ and $y_{i+1}$ to impart a phase φ(y) onto a light beam that passes through an acousto-optic material in the +x direction is given by Equation (4):

$$f(y_i) = \frac{v}{2\pi} \frac{\phi(y_{i+1}) - \varphi(y_i)}{y_{i+1} - y_i}, \text{ for } i = 1 \text{ to } N. \quad \text{Equation (4)}$$

In Equation (4), v is the speed of sound in the acousto-optic material, f is the frequency of the acoustic wave applied to the acousto-optic material, and φ(y) is the desired phase along the y dimension to be applied to the beam that passes through the acousto-optic material. Equation (4) is provided as an example, and other known approaches may be used to relate the frequency of the applied acoustic wave to a desired phase pattern. For example, Konstantinou, et al., "Dynamic wavefront shaping with an acousto-optic lens for laser scanning microscopy," Optics Express, 21 Mar. 2016, Vol. 6, No. 6, pp. 6283-6299, derives a relationship between a phase pattern on a light beam that exits from a pair of acousto-optic devices and a frequency of the acoustic wave applied to the acousto-optic device.

In FIG. 7B, beam 106 is depicted as being at some angle from the x-axis, so that it is not normally incident on the transient diffractive element 117. This angle may be selected, for example, to optimize diffraction from the transient diffractive element. (For simplicity, this angle is not shown in various other figures, such as in FIGS. 2 and 3.)

Figure 8:
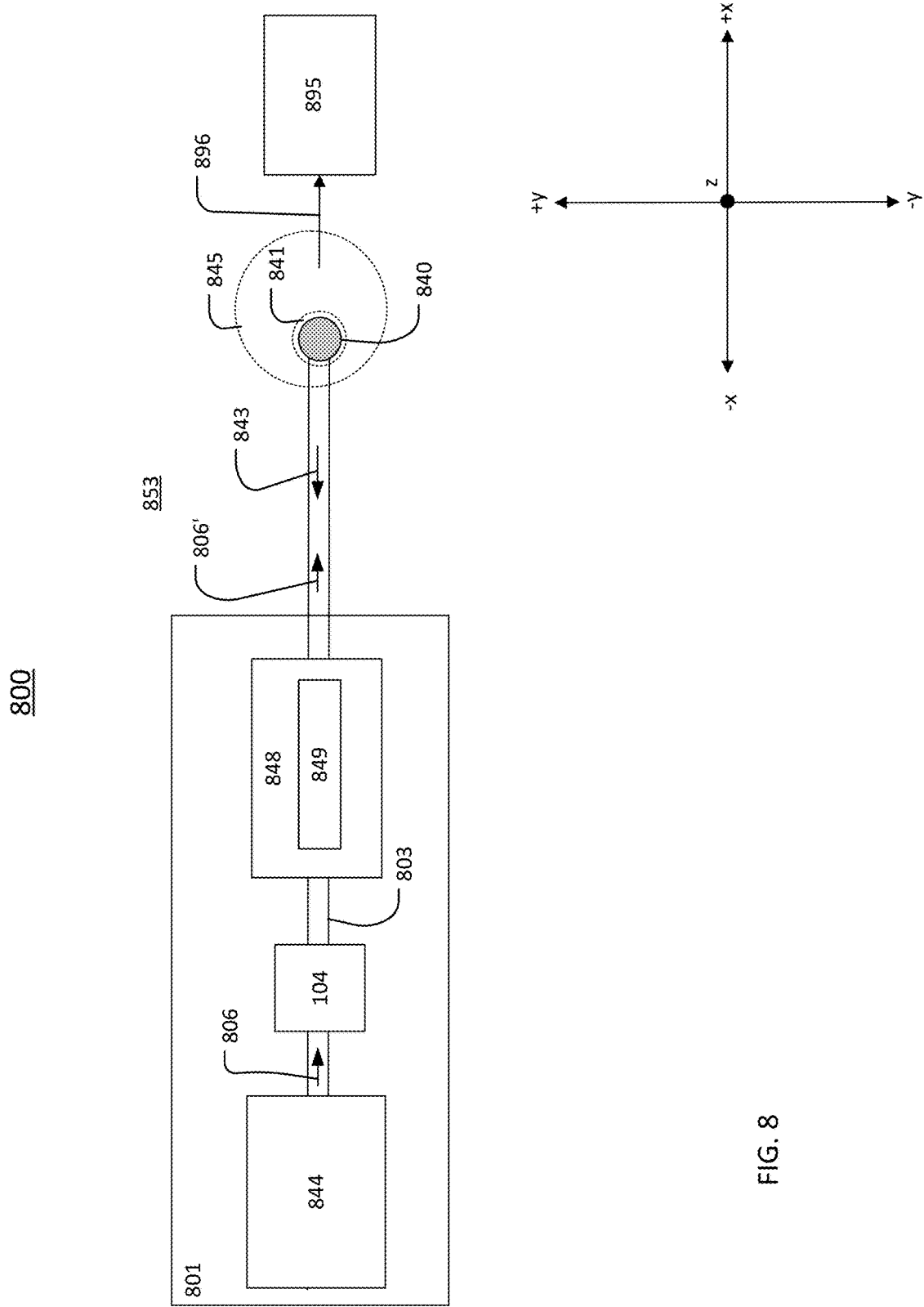

Referring to FIG. 8, a block diagram of an exemplary photolithography system 800 that includes the acousto-optic system 104 is shown. The example of FIG. 8 includes the acousto-optic system 104. However, either of the acousto-optic system 204 or 404, both of which are implementations of the acousto-optic system 104, may be used.

The photolithography system 800 includes an EUV light source 853, which includes a light source 801 that produces an amplified light beam 806'. The amplified light beam 806' is emitted from the light source 801 and propagates along a path 803 in a direction +x toward a target region 845. The target region 845 receives a target 840, which includes material that emits EUV light 896 when converted to plasma through an interaction with the amplified light beam 806'. The EUV light 896 is provided to a lithography tool 895. The lithography tool 895 receives and exposes substrates (for example, silicon wafers) with the EUV light 896 to form microelectronic features on the wafer.

The target 840 is reflective at the wavelength or wavelengths of the amplified light beam 806'. Because the target 840 is reflective, when the amplified light beam 806' interacts with the target 840, all or part of the amplified beam 806' may be reflected along the path 803 in a direction that is different from the +x direction. The reflected portion of the beam 806 is labeled as the reflection 843. The reflection 843 may travel on the path 803 in the −x direction (which is opposite to the +x direction) and back into the light source 801. Reflections of a forward-going beam (a beam that propagates from the light source 801 toward the target region 845), such as the reflection 843, are referred to as "back reflections."

The light source 801 includes a light-generation module 844, the acousto-optic system 104, and an optical amplifier 848. The light-generation module 844 is a source of light (such as one or more lasers, lamps, or any combination of such elements). The light-generation module 844 may be, for example, a carbon dioxide ($CO_2$) laser that emits light having a wavelength of 10.26 µm or 10.59 µm. The optical amplifier 848 has a gain medium 849, which is on the beam path 803. When the gain medium 849 is excited, the gain medium 849 provides photons to the light beam 806, amplifying the light beam 806 to produce an amplified light beam 806'. The optical amplifier 848 may include more than one optical amplifier arranged with the respective gain mediums on the path 803. The optical amplifier 848 may be all or part of a drive laser system, such as the drive laser system 1280 of FIG. 12B.

The light-generation module 844 emits the light beam 806 onto the beam path 803 toward the acousto-optic system 104. The acousto-optic system 104 allows the light beam 806 to propagate toward the target region 845. However, the acousto-optic system 104 blocks the back reflection 843. In addition, the acousto-optic system 104 also compensates for physical effects in the acousto-optic system 104 using the process 500. Thus, the acousto-optic system 104 preforms a primary purpose of blocking or reducing back reflections and also compensates for physical effects that may arise from using the acousto-optic system 104 without adding additional optical elements to the system 800.

Referring to FIG. 9A, a block diagram of an EUV light source 953 that includes an exemplary light source 901 and the acousto-optic system 104 is shown. The light source 901 may be used in place of the light source 801 in the optical system 800 (FIG. 8). The light source 901 includes a light-generation module 944, which includes two optical subsystems 944a, 944b, the optical amplifier 848, and the acousto-optic system 104. The acousto-optic system 104 is on the path 903 and between the optical amplifier 848 and the light-generation module 944.

The optical subsystems 944a, 944b produce first and second light beams 906a, 906b, respectively. The optical subsystems 944a, 944b may be, for example, two lasers. In the example of FIG. 9A, the optical subsystems 944a, 944b are two carbon dioxide ($CO_2$) lasers. However, in other implementations, the optical subsystems 944a, 944b are different types of lasers. For example, the optical subsystem 944a may be a solid state laser, and the optical subsystem 944b may be a $CO_2$ laser.

The first and second light beams 906a, 906b have different wavelengths. For example, in implementations in which the optical subsystems 944a, 944b include two $CO_2$ lasers, the wavelength of the first light beam 906a may be about 10.26 micrometers (µm) and the wavelength of the second light beam 906b may be between 10.18 µm and 10.26 µm. The wavelength of the second light beam 906b may be about 10.59 µm. In these implementations, the light beams 906a, 906b are generated from different lines of the $CO_2$ laser, resulting in the light beams 906a, 906b having different wavelengths even though both beams are generated from the same type of source. The light beams 906a, 906b also may have different energies or intensities.

The light-generation module 944 also includes a beam combiner 949, which directs the first and second beams 906a, 906b onto the beam path 903. The beam combiner 949 may be any optical element or a collection of optical elements capable of directing the first and second beams 906a, 906b onto the beam path 903. For example, the beam combiner 949 may be a collection of mirrors, some of which are positioned to direct the first beam 906a onto the beam path 943 and others of which are positioned to direct the second beam 906b onto the beam path 943. The light-generation module 944 also may include a pre-amplifier 947, which amplifies the first and second beams 906a, 906b within the light-generation module 944.

The first and second beams 906a, 906b may propagate on the path 903 at different times, but the first and second beams 906a, 906b follow the path 903 and both beams 906a, 906b traverse substantially the same spatial region to the acousto-optic system 104 and through the optical amplifier 848.

The first and second beams 906a, 906b are angularly disbursed by a beam delivery system 955 such that the first beam 906a is directed toward an initial target region 945a, and the second beam 906b is directed toward a modified target region 945b, which is displaced in the −y direction relative to the initial target region 945a. In some implementations, the beam delivery system 955 also focuses the first and second beams 906a, 906b to locations within or near the initial and modified target regions 945a, 945b, respectively.

In the example shown in FIG. 9A, the initial target region 945a receives an initial target 940a and the first beam 906a. The first beam 906a has an energy that is sufficient to modify the geometric distribution of target material in the initial target 940a (or to initiate the spatial reconfiguration of the target material) into a modified target that is received in the modified target region 945b. The second beam 906b is also received in the modified target region 945b. The second beam 906b has an energy that is sufficient to convert at least some of the target material in the modified target 940b into a plasma that emits EUV light. In this example, the first beam 906a may be referred to as a "pre-pulse", and the second beam 906b may be referred to as the "main pulse." The first beam 906a may reflect off of the initial target 940a, giving rise to a back reflection 943a, and the second beam 906b may reflect off the target 940b, giving rise to a back reflection 943b. Both of the back reflections 943a, 943b may propagate along the path 903 in a direction other than the +x direction and into the optical amplifier 848.

The acousto-optic system 104 may prevent the back reflections 943a and/or 943b from entering the light-generation module 944. In addition to performing the function of blocking or reducing back reflections, the acousto-optic system 104 also compensates for physical effects in the acousto-optic system 104 using the process 500 (FIG. 5). Furthermore, physical effects arising in other portions of the system 900, such as, for example, the beam combiner 949 or the pre-amplifier 947, may be compensated using the acousto-optic system 104 and the process 500.

Referring to FIG. 9B, a block diagram of an exemplary acousto-optic system 904B is shown. The acousto-optic system 904B may be used as the acousto-optic system 104 in the optical source 901 (FIG. 9A), the optical source 801 (FIG. 8), or in any other optical source.

The acousto-optic system 904B includes a dichroic optical element 971, reflective elements 972, an acousto-optic device 911B, and a dichroic element 976. The acousto-optic system 904B also may include optical arrangements 973, 974. The optical arrangements 973, 974 may, for example, enlarge or reduce the diameter of a light beam that passes through the arrangements. The dichroic elements 971 and 976 are on the beam path 903. The dichroic elements 971 and 976 may be any optical component that is capable of separating or filtering light according to its wavelength. For example, the dichroic elements 971 and 976 may be dichroic mirrors, dichroic filters, dichroic beam splitters, or a combination of such elements. The dichroic elements 971 and 976 may be identical to each other, or they may have different configurations. In the example of FIG. 9B, the dichroic elements 971 and 976 reflect the wavelength (or wavelengths) of the first beam 906a and transmit the wavelength (or wavelengths) of the second beam 906b.

The first beam 906a is reflected from the dichroic element 971 onto a beam path 975. In the example of FIGS. 9B and 9C, the path 975 is shown with a dash-dot line. The path 975 is between the dichroic elements 971 and 976 and has a spatial extent and form defined by the reflective elements 972. The beam path 975 is different from the beam path 903. Thus, in the acousto-optic system 904B, the first beam 906a does not remain on the beam path 903, and the first and second beams 906a, 906b are travel on spatially different paths between the elements 971 and 976. The first beam 906a propagates on the beam path 975 through the optical arrangements 973, 974, and the acousto-optic device 911B before reaching the dichroic element 976, which reflects the beam 906a back onto the beam path 903. The second beam 906b passes through the dichroic element 971 and through the dichroic element 976, remaining on the beam path 903 while propagating through the acousto-optic system 904B.

The acousto-optic device 911B is on the beam path 975 between the dichroic elements 971 and 976. The acousto-optic device 911B is an optical element that is capable of deflecting incident light onto the beam path 975 or away from the beam path 975. For example, the acousto-optic system 204 (FIGS. 2 and 3) or 404 (FIG. 4A) may be used as the acousto-optic device 911B. The acousto-optic device 911B includes one or more acousto-optic materials and associated transducers, which vibrate to inject acoustic waves into the acousto-optic materials.

The acousto-optic device 911B may operate in a "normally on" or a "normally off" mode. When the acousto-optic device 911B is operated in the "normally on" mode, an acoustic wave is applied to the acousto-optic material of the device 911B to intentionally deflect light beam 906a onto the beam path 975 such that the light beam 906a propagates toward the amplifiers 848. The acoustic wave has a frequency content such that the light beam 906a is deflected onto the beam path 975 and the wavefront of the light beam 906a is also compensated for a distortion caused at least in part by a physical effect the acousto-optic material. For example, the acoustic wave may be a superposition of a constant frequency wave and a chirped frequency wave. The acoustic wave is not applied to the acousto-optic material during time periods when the reflection 943a is expected to propagate on the path 975. Because no acoustic wave is applied, the acousto-optic material does not deflect the reflection 943a onto the path 975. Thus, the reflection 943a is blocked and does not reach the light-generation module 944.

When the acousto-optic device 911B is operated in the "normally off" mode, a frequency-chirped acoustic wave may be applied to the acousto-optic material when the light beam 906a travels on the beam path 975. The frequency-chirped acoustic wave is such that the beam 906a remains on the beam path 975 and propagates to the amplifiers 848. The frequency-chirped acoustic wave may result in angular deflection, however, the amount of deflection and the arrangement of the elements downstream of the device 911B is such that the beam 906a remains on the path 975. The frequency-chirped acoustic wave also compensates for wavefront distortions in the light beam 906a. At times when the reflection 943a is expected to be present on the path 975, a constant frequency acoustic wave may be applied to the acousto-optic material instead of or in addition to the frequency chirped acoustic wave. The constant frequency acoustic wave deflects the reflection 943a from the path 975 such that the reflection 943a does not reach the light-generation module 944.

Referring to FIG. 9C, a block diagram of another exemplary acousto-optic system 904C is shown. The acousto-optic system 904C may be used as the acousto-optic system 104 in the optical source 901 (FIG. 9A), the optical source 801 (FIG. 8), or in any other optical source.

The acousto-optic system 904C is similar to the acousto-optic system 904B (FIG. 9B), except the acousto-optic system 904C also includes a second acousto-optic device 911C. The acousto-optic system 204 (FIGS. 2 and 3) or 404 (FIG. 4A) may be used as the second acousto-optic device 911C. The second acousto-optic device 911C is between the dichroic optical element 971 and the dichroic optical element 976. As discussed above, the dichroic optical element 971 transmits the wavelength of the second light beam 906b. Thus, the second light beam 906b passes through the dichroic optical element 971 and is incident on the second acousto-optic device 911C.

Like the acousto-optic device 911B, the second acousto-optic device 911C may be operated in the "normally off" mode or the "normally on" mode. Thus, the device 911C is used to compensate the wavefront of the light beam 906b (which propagates to the target location 945b of FIG. 9A), and the device 911C is also used to prevent the reflection 943b from reaching the light-generation module 944. FIGS.

Figure 10:
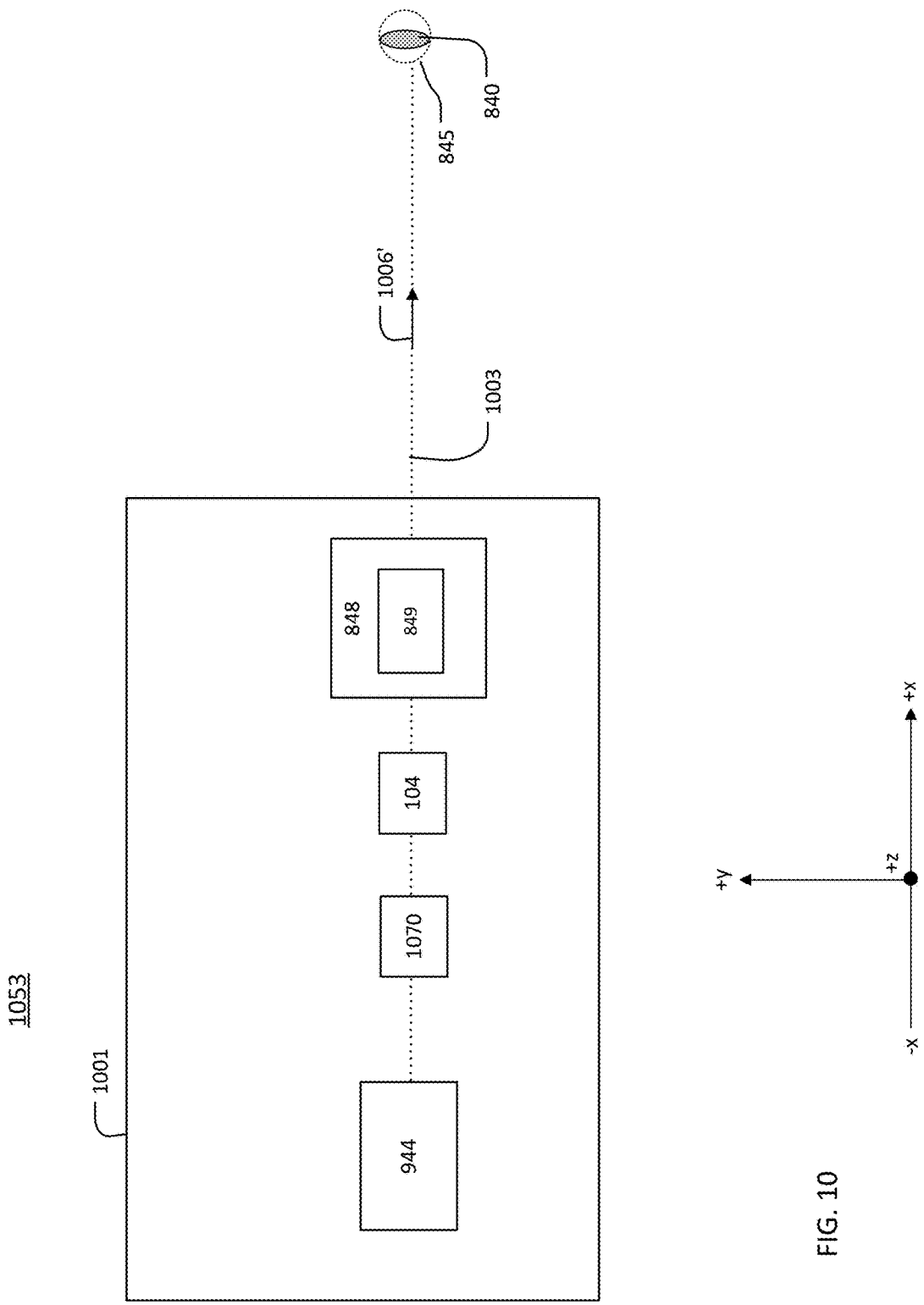

10 and 11 show additional exemplary EUV light sources that include the acousto-optic system 104 (or the system 204 or the system 404). FIG. 10 is a block diagram of another exemplary EUV light source 1053. The EUV light source 1053 illustrates that the acousto-optic system 104 (or the system 204 or the system 404) may be used with an additional optical isolation device 1070. The X labels in FIG. 11 illustrate the various possible locations that the acousto-optic system 104 (or the system 204, 304, or 404) may be placed in the EUV light source.

The EUV light source 1053 includes a light source 1001 that generates a light beam 1006 on the path 1003. The light source 1001 includes the light-generation module 944, a pre-amplifier 947, the acousto-optic system 104, and the amplifier 848. In this example, the acousto-optic system 104 is on the path 1003 between the light-generation module 944 and the amplifier 848. The optical isolation device 1070 is placed on the path 1003 between a light-generation module 1004 and the target region 845. In the example of FIG. 10, the optical isolation device 1070 is between the acousto-optic system 104 and the light-generation module 944. In other implementations, the acousto-optic system 104 and/or the optical isolation device 1070 may be in other locations along the path 1003.

The optical isolation device 1070 is used to block reflections from the target region 845, including reflections of the light beam or beams generated by the light-generation module 944. The optical isolation device 1070 may be, for example, a wavelength-based filter or a filter that is based on polarization. A polarization-based optical isolation device transmits light of a first polarization (allows such light to remain on the path 1003) and blocks light of a second polarization (such that light having that polarization is not able to propagate on the path 1003). The optical isolation device 1070 may be, for example, a spatial filter, such as a pinhole or other aperture.

Figure 11:
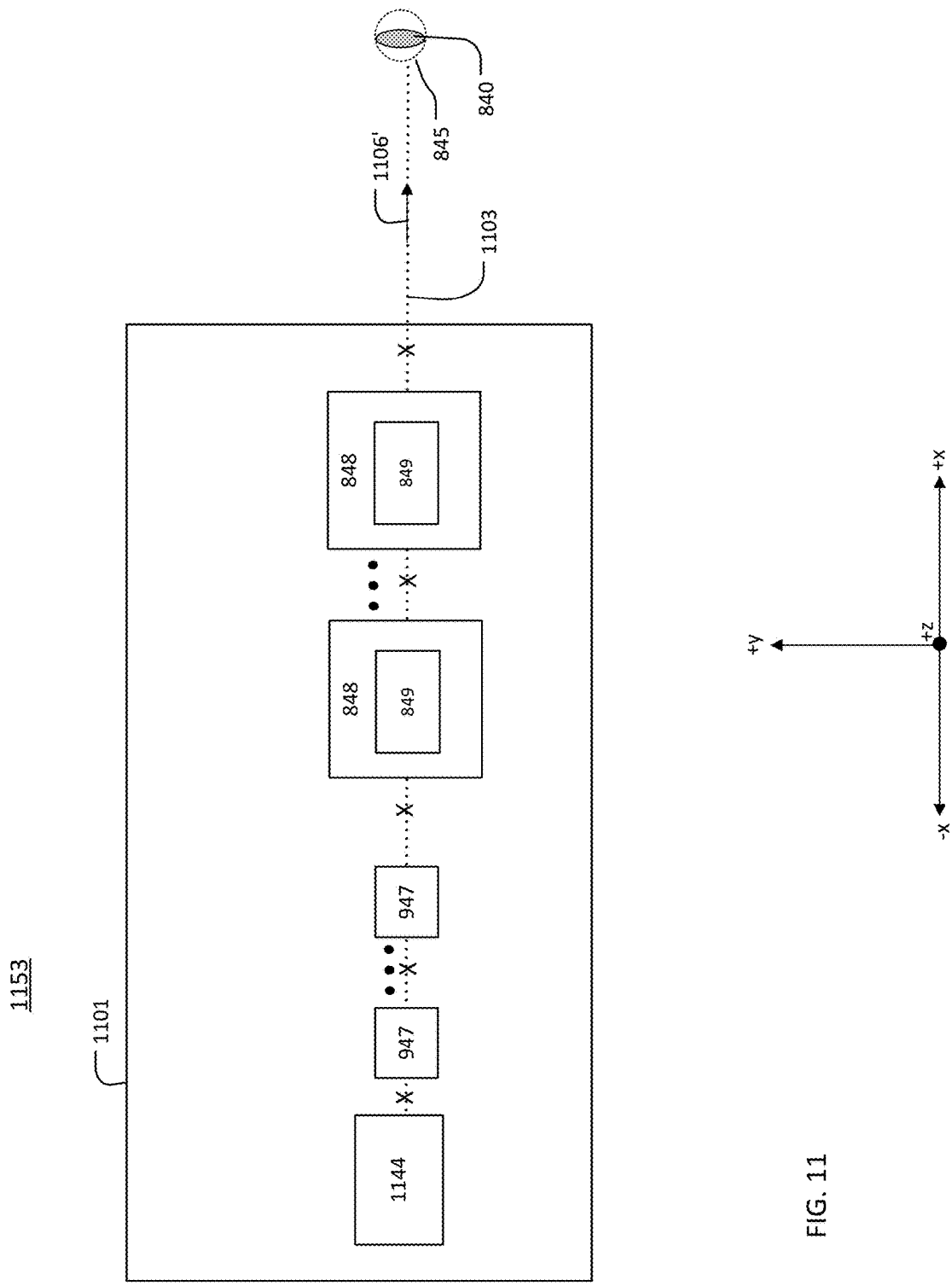

Referring to FIG. 11, the EUV light source 1153 includes the light source 1101 that generates a light beam 1106 on the path 1103. The light source 1101 includes a light-generation module 1144, a plurality of pre-amplifiers 947, and a plurality of amplifiers 848. The light source 1101 also includes the acousto-optic system 104 (or the system 204 the system 404). The acousto-optic system 104 is not shown in FIG. 11. Instead, the X marks on the path 1103 illustrate the various locations where the acousto-optic system 104 may be placed. The acousto-optic system 104 may be placed directly downstream (in the +x direction in this example) of the light-generation module 1144. The acousto-optic system 104 may be placed between any two of the pre-amplifiers 947, between any two of the amplifiers 848, between the final pre-amplifier 947 and the first amplifier 848, and/or after the final amplifier 848.

Referring to FIG. 12A, a laser-produced plasma (LPP) EUV light source 1200 is shown. Any of the light sources 102 and 801-1102 may be part of an EUV light source, such as the source 1200. The LPP EUV light source 1200 is formed by irradiating a target mixture 1214 at a target location 1205 with an amplified light beam 1210 that travels along a beam path toward the target mixture 1214. The target material of the targets 840, 940*a*, and 940*b* may be or include the target mixture 1214. The target location 1205, which is also referred to as the irradiation site, is within an interior 1207 of a vacuum chamber 1230. When the amplified light beam 1210 strikes the target mixture 1214, a target material within the target mixture 1214 is converted into a plasma state that has an element with an emission line in the EUV range. The created plasma has certain characteristics that depend on the composition of the target material within the target mixture 1214. These characteristics may include the wavelength of the EUV light produced by the plasma and the type and amount of debris released from the plasma.

The light source 1200 also includes a target material delivery system 1225 that delivers, controls, and directs the target mixture 1214 in the form of liquid droplets, a liquid stream, solid particles or clusters, solid particles contained within liquid droplets or solid particles contained within a liquid stream. The target mixture 1214 includes the target material such as, for example, water, tin, lithium, xenon, or any material that, when converted to a plasma state, has an emission line in the EUV range. For example, the element tin may be used as pure tin (Sn); as a tin compound, for example, $SnBr_4$, $SnBr_2$, $SnH_4$; as a tin alloy, for example, tin-gallium alloys, tin-indium alloys, tin-indium-gallium alloys, or any combination of these alloys. The target mixture 1214 may also include impurities such as non-target particles. Thus, in the situation in which there are no impurities, the target mixture 1214 is made up of only the target material. The target mixture 1214 is delivered by the target material delivery system 1225 into the interior 1207 of the chamber 1230 and to the target location 1205.

The light source 1200 includes a drive laser system 1215 that produces the amplified light beam 1210 due to a population inversion within the gain medium or mediums of the laser system 1215. The light source 1200 includes a beam delivery system between the laser system 1215 and the target location 1205, the beam delivery system including a beam transport system 1220 and a focus assembly 1222. The beam transport system 1220 receives the amplified light beam 1210 from the laser system 1215, and steers and modifies the amplified light beam 1210 as needed and outputs the amplified light beam 1210 to the focus assembly 1222. The focus assembly 1222 receives the amplified light beam 1210 and focuses the beam 1210 to the target location 1205.

In some implementations, the laser system 1215 may include one or more optical amplifiers, lasers, and/or lamps for providing one or more main pulses and, in some cases, one or more pre-pulses. Each optical amplifier includes a gain medium capable of optically amplifying the desired wavelength at a high gain, an excitation source, and internal optics. The optical amplifier may or may not have laser mirrors or other feedback devices that form a laser cavity. Thus, the laser system 1215 produces an amplified light beam 1210 due to the population inversion in the gain media of the laser amplifiers even if there is no laser cavity. Moreover, the laser system 1215 may produce an amplified light beam 1210 that is a coherent laser beam if there is a laser cavity to provide enough feedback to the laser system 1215. The term "amplified light beam" encompasses one or more of: light from the laser system 1215 that is merely amplified but not necessarily a coherent laser oscillation and light from the laser system 1215 that is amplified and is also a coherent laser oscillation.

The optical amplifiers in the laser system 1215 may include as a gain medium a filling gas that includes $CO_2$ and may amplify light at a wavelength of between about 9100 and about 11000 nm, and in particular, at about 10600 nm, at a gain greater than or equal to 800. Suitable amplifiers and lasers for use in the laser system 1215 may include a pulsed laser device, for example, a pulsed, gas-discharge $CO_2$ laser device producing radiation at about 9300 nm or about 10600 nm, for example, with DC or RF excitation, operating at relatively high power, for example, 10 kW or higher and high pulse repetition rate, for example, 40 kHz or more. The optical amplifiers in the laser system 1215 may also include a cooling system such as water that may be used when operating the laser system 1215 at higher powers.

FIG. 12B shows a block diagram of an exemplary drive laser system 1280. The drive laser system 1280 may be used as part of the drive laser system 1215 in the source 1200. The drive laser system 1280 includes three power amplifiers 1281, 1282, and 1283. Any or all of the power amplifiers 1281, 1282, and 1283 may include internal optical elements (not shown).

Light 1284 exits the power amplifier 1281 through an output window 1285 and is reflected off a curved mirror 1286. After reflection, the light 1284 passes through a spatial filter 1287, is reflected off of a curved mirror 1288, and enters the power amplifier 1282 through an input window 1289. The light 1284 is amplified in the power amplifier 1282 and redirected out of the power amplifier 1282 through an output window 1290 as light 1291. The light 1291 is directed toward the amplifier 1283 with a fold mirror 1292 and enters the amplifier 1283 through an input window 1293. The amplifier 1283 amplifies the light 1291 and directs the light 1291 out of the amplifier 1283 through an output window 1294 as an output beam 1295. A fold mirror 1296 directs the output beam 1295 upward (out of the page) and toward the beam transport system 1220 (FIG. 12A).

Referring again to FIG. 12B, the spatial filter 1287 defines an aperture 1297, which may be, for example, a circle having a diameter between about 2.2 mm and 3 mm. The curved mirrors 1286 and 1288 may be, for example, off-axis parabola mirrors with focal lengths of about 1.7 m and 2.3 m, respectively. The spatial filter 1287 may be positioned such that the aperture 1297 coincides with a focal point of the drive laser system 1280.

Referring again to FIG. 12A, the light source 1200 includes a collector mirror 1235 having an aperture 1240 to allow the amplified light beam 1210 to pass through and reach the target location 1205. The collector mirror 1235 may be, for example, an ellipsoidal mirror that has a primary focus at the target location 1205 and a secondary focus at an intermediate location 1245 (also called an intermediate focus) where the EUV light may be output from the light source 1200 and may be input to, for example, an integrated circuit lithography tool (not shown). The light source 1200 may also include an open-ended, hollow conical shroud 1250 (for example, a gas cone) that tapers toward the target location 1205 from the collector mirror 1235 to reduce the amount of plasma-generated debris that enters the focus assembly 1222 and/or the beam transport system 1220 while allowing the amplified light beam 1210 to reach the target location 1205. For this purpose, a gas flow may be provided in the shroud that is directed toward the target location 1205.

The light source 1200 may also include a master controller 1255 that is connected to a droplet position detection feedback system 1256, a laser control system 1257, and a beam control system 1258. The light source 1200 may include one or more target or droplet imagers 1260 that provide an output indicative of the position of a droplet, for example, relative to the target location 1205 and provide this output to the droplet position detection feedback system 1256, which may, for example, compute a droplet position and trajectory from which a droplet position error may be computed either on a droplet by droplet basis or on average. The droplet position detection feedback system 1256 thus provides the droplet position error as an input to the master controller 1255. The master controller 1255 may therefore provide a laser position, direction, and timing correction signal, for example, to the laser control system 1257 that may be used, for example, to control the laser timing circuit and/or to the beam control system 1258 to control an amplified light beam position and shaping of the beam transport system 1220 to change the location and/or focal power of the beam focal spot within the chamber 1230.

The target material delivery system 1225 includes a target material delivery control system 1226 that is operable, in response to a signal from the master controller 1255, for example, to modify the release point of the droplets as released by a target material supply apparatus 1227 to correct for errors in the droplets arriving at the desired target location 1205.

Additionally, the light source 1200 may include light source detectors 1265 and 1270 that measures one or more EUV light parameters, including but not limited to, pulse energy, energy distribution as a function of wavelength, energy within a particular band of wavelengths, energy outside of a particular band of wavelengths, and angular distribution of EUV intensity and/or average power. The light source detector 1265 generates a feedback signal for use by the master controller 1255. The feedback signal may be, for example, indicative of the errors in parameters such as the timing and focus of the laser pulses to properly intercept the droplets in the right place and time for effective and efficient EUV light production.

The light source 1200 may also include a guide laser 1275 that may be used to align various sections of the light source 1200 or to assist in steering the amplified light beam 1210 to the target location 1205. In connection with the guide laser 1275, the light source 1200 includes a metrology system 1224 that is placed within the focus assembly 1222 to sample a portion of light from the guide laser 1275 and the amplified light beam 1210. In other implementations, the metrology system 1224 is placed within the beam transport system 1220. The metrology system 1224 may include an optical element that samples or re-directs a subset of the light, such optical element being made out of any material that may withstand the powers of the guide laser beam and the amplified light beam 1210. A beam analysis system is formed from the metrology system 1224 and the master controller 1255 since the master controller 1255 analyzes the sampled light from the guide laser 1275 and uses this information to adjust components within the focus assembly 1222 through the beam control system 1258.

Thus, in summary, the light source 1200 produces an amplified light beam 1210 that is directed along the beam path to irradiate the target mixture 1214 at the target location 1205 to convert the target material within the mixture 1214 into plasma that emits light in the EUV range. The amplified light beam 1210 operates at a particular wavelength (that is also referred to as a drive laser wavelength) that is determined based on the design and properties of the laser system 1215. Additionally, the amplified light beam 1210 may be a laser beam when the target material provides enough feedback back into the laser system 1215 to produce coherent laser light or if the drive laser system 1215 includes suitable optical feedback to form a laser cavity.

Other implementations are within the scope of the claims. For example, the light source 102 may be any kind of light source, or may be a mirror or optical element that passively directs light toward the acousto-optic system 104 but is not necessarily an active light source.

What is claimed is:
1. A method comprising:
estimating a wavefront of a light beam that exits an acousto-optic material;

generating a control signal for an acousto-optic system that comprises the acousto-optic material, the control signal being based on the estimated wavefront of the light beam; and applying the control signal to the acousto-optic system to generate a frequency-chirped acoustic wave that propagates in the acousto-optic material, the frequency-chirped acoustic wave forming a transient diffractive element in the acousto-optic material, an interaction between the transient diffractive element and the light beam adjusting the wavefront of the light beam to compensate for a distortion of the wavefront of the light beam, the distortion of the wavefront being at least partially caused by a physical effect in the acousto-optic material.

2. The method of claim 1, wherein estimating the wavefront of the light beam that exits the acousto-optic material comprises:
receiving at least a portion of the light beam that exits the acousto-optic material, and
estimating the wavefront of the light beam that exits the acousto-optic material based on the received portion of the light beam.

3. The method of claim 1, wherein the physical effect of the acousto-optic material comprises a thermal distortion of the acousto-optic material, the thermal distortion at least partially causing the distortion of the wavefront of the light beam that exits the acousto-optic material.

4. The method of claim 3, wherein estimating the wavefront of the light beam that exits the acousto-optic material comprises:
accessing a plurality of temperature measurements of the acousto-optic material, each of the plurality of temperature measurements being a temperature of a different portion of the acousto-optic material,
estimating, based on the accessed plurality of temperatures, a temperature distribution of the acousto-optic material,
estimating, based on the estimated temperature distribution of the acousto-optic material, a spatial distribution of an index of refraction of the acousto-optic material, and
estimating the wavefront of the light beam that exits the acousto-optic material using the estimated index of refraction of the acousto-optic material.

5. The method of claim 1, wherein the acousto-optic material absorbs one or more of the light beam, the frequency-chirped acoustic wave, and an acoustic wave other than the frequency-chirped acoustic wave that propagates in the acousto-optic material as heat, and the physical effect of the acousto-optic material comprises a thermal distortion arising from the absorbed heat.

6. The method of claim 2, wherein the transient diffractive element further compensates the light beam for effects other than the physical effect of the acousto-optic material.

7. The method of claim 6, wherein the effects other than the physical effect of the acousto-optic material comprise a physical effect of an optical element other than the acousto-optic material, the optical element being positioned to interact with the light beam.

8. The method of claim 2, wherein:
the light beam comprises a pulsed light beam,
receiving at least a portion of the light beam comprises receiving a portion of a first pulse of the light beam,
determining a wavefront of the light beam comprises determining a wavefront based on the received portion of the first pulse of the light beam, and
the generated frequency-chirped acoustic wave propagates in the acousto-optic material and forms the transient diffractive element while a second pulse of the light beam passes through the acousto-optic material, the second pulse of the light beam occurring after the first pulse of the light beam.

9. The method of claim 8, wherein
the first and second pulses have a temporal duration of 100 nanoseconds (ns) or less, and
the transient diffractive element propagates 500 microns (μm) or less in the acousto-optic material while the second pulse passes through the acousto-optic material such that the second pulse interacts with the transient diffractive element and is diffracted by the transient diffractive element at an angle that depends on a frequency of the frequency-chirped acoustic wave.

10. The method of claim 1, wherein the physical effect of the acousto-optic material comprises a thermal distortion of the acousto-optic material, the thermal distortion at least partially causing a distortion of the wavefront of the light beam that exits the acousto-optic material.

11. The method of claim 1, further comprising:
generating an initial control signal for the acousto-optic system, the initial control signal being independent of the estimated wavefront of the light beam; and
applying the initial control signal to the acousto-optic system to generate a constant frequency acoustic wave in the acousto-optic material prior to estimating the wavefront of the light beam, the constant frequency acoustic wave forming an initial transient diffractive element in the acousto-optic material, wherein generation of the initial transient diffractive element is the physical effect that at least partially causes the distortion of the wavefront.

12. A system for an extreme ultraviolet (EUV) light source, the system comprising:
an optical system comprising:
an acousto-optic material in which acoustic waves propagate, the acousto-optic material being configured to be positioned on a beam path, and
an acoustic wave generator comprising:
a transducer configured to couple to the acousto-optic material, and
a waveform generator configured to couple to the transducer;
a sensing apparatus configured to measure data related to a light beam that propagates on the beam path or data related to a condition of the acousto-optic material; and
a control system coupled to the sensing apparatus and the waveform generator, the control system being configured to:
estimate a wavefront of the based on data measured by the sensing apparatus,
generate a control signal based on the estimated wavefront of the light beam, and
provide the control signal to the optical system, the control signal being sufficient to cause the acoustic wave generator to provide a frequency-chirped acoustic wave to the acousto-optic material, the frequency-chirped acoustic wave forming a transient diffractive element in the acousto-optic material, an interaction between the transient diffractive element and the light beam adjusting the wavefront of the light beam to compensate for a physical effect of the acousto-optic material.

13. The system of claim 12, wherein the physical effect of the acousto-optic material comprises a spatially varying index of refraction in the acousto-optic material.

14. The system of claim 13, wherein the physical effect of the acousto-optic material comprises a thermal distortion, and the index of refraction at any particular location within the acousto-optic material is related to an amount of heat absorbed by the acousto-optic material and a distance between one or more absorption locations and the particular location, the absorption locations being a region in the crystal where heat is absorbed.

15. The system of claim 12, wherein the acousto-optic material absorbs one or more of the light beam, the frequency-chirped acoustic wave, and an acoustic wave other than the frequency-chirped acoustic wave that propagates in the acousto-optic material, and the physical effect of the acousto-optic material comprises a thermal distortion arising from the absorbed heat.

16. The system of claim 12, wherein the acousto-optic material comprises a material that is substantially transparent to light having a wavelength between 10 µm and 11 µm.

17. The system of claim 12, wherein the acousto-optic material comprises germanium (Ge) or gallium arsenide (GaAs).

18. The system of claim 12, wherein the optical system lacks an acoustic terminator, the acoustic terminator being an element that is part of or in physical connection with the acousto-optic material and configured to perform one or more of absorption, scattering, transmission, or redirection of the frequency-chirped acoustic wave.

19. The system of claim 12, wherein the sensing apparatus is configured to measure data related to the light beam that propagates on the beam path.

20. The system of claim 12, wherein the optical system further comprises a radio-frequency (RE) electrical amplifier coupled to the waveform generator and the transducer; the waveform generator being configured to couple to the transducer through the RF electrical amplifier.

21. The system of claim 12, wherein the sensing apparatus is configured to measure data related to a condition of the acousto-optic material, the condition being related to a temperature of the acousto-optic material.

22. An extreme ultraviolet (EUV) light source comprising:
a light-generation module;
one or more pre-amplifiers;
one or more power amplifiers, one or more pre-amplifiers being between the light-generation module and the one or more power amplifiers; and
an acousto-optic system comprising:
an acousto-optic material between one of the one or more power amplifiers and the light-generation module,
a waveform generator,
a transducer configured to send a waveform from the waveform generator into the acousto-optic material as an acoustic wave, and
a control system coupled to the waveform generator, the control system configured to estimate a wavefront of a light beam that exits the acousto-optic material and provide a control signal based on the estimated wavefront to the waveform generator, the control signal being sufficient to cause the waveform generator to generate a frequency-chirped waveform that, when injected into the acousto-optic material by the transducer, compensates the wavefront of a light beam propagating in the acousto-optic material for a physical effect of the acousto-optic material.

23. The EUV light source of claim 22, wherein the acousto-optic material is between one of the pre-amplifiers and one of the power amplifiers.

24. The EUV light source of claim 22, further comprising a temperature sensor coupled to the control system, the temperature sensor configured to measure a temperature of the acousto-optic material, and wherein
the control system configured to determine a temperature of the acousto-optic material based on data from the temperature sensor, and to estimate the wavefront of the light beam that exits the acousto-optic material based on the determined temperature.

25. The EUV light source of claim 22, further comprising an optical sensing apparatus configured to receive the light that exits the acousto-optic material and to sense a wavefront of the received light, and wherein
the control system is configured to determine the wavefront of the received light based on data from the optical sensing apparatus and to estimate the wavefront of the light beam that exits the acousto-optic material based on the determined wavefront.

26. The EUV light source of claim 25, wherein the optical sensing apparatus comprises one or more of a graded phase mask, a wavefront sensing camera, and an interferometer.

27. A method comprising:
applying a constant frequency acoustic wave to an acousto-optic material, the constant frequency acoustic wave forming an initial transient diffractive element in the acousto-optic material;
estimating a wavefront of a light beam that exits the acousto-optic material after interacting with the initial transient diffractive element;
modifying the constant frequency acoustic wave based on the estimated wavefront to form a modified acoustic wave, the modified acoustic wave comprising a frequency chirp; and
applying the modified acoustic wave to the acousto-optic material, the modified acoustic wave forming a corrective transient diffractive element, an interaction between the corrective transient diffractive element and the light beam adjusting the wavefront of the light beam to compensate for a distortion of the wavefront, the distortion being at least partially caused by the generation of the initial transient diffractive element.

28. The method of claim 27, wherein the wavefront of the light beam that exits the acousto-optic material is estimated based on the temperature of the acousto-optic material.

29. The method of claim 27, wherein estimating the wavefront of the light beam that exits the acousto-optic material comprises measuring the wavefront of the light beam that exits the acousto-optic material.

* * * * *